United States Patent
Shibazaki

(10) Patent No.: US 8,400,614 B2
(45) Date of Patent: Mar. 19, 2013

(54) PATTERN FORMATION METHOD AND PATTERN FORMATION APPARATUS, EXPOSURE METHOD AND EXPOSURE APPARATUS, AND DEVICE MANUFACTURING METHOD

(75) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 1095 days.

(21) Appl. No.: 12/144,226

(22) Filed: Jun. 23, 2008

(65) Prior Publication Data

US 2008/0291415 A1 Nov. 27, 2008

Related U.S. Application Data

(63) Continuation of application No. PCT/JP2006/326249, filed on Dec. 28, 2006.

(30) Foreign Application Priority Data

Dec. 28, 2005 (JP) .................. 2005-379948

(51) Int. Cl.
*G03B 27/42* (2006.01)
*G03B 27/58* (2006.01)

(52) U.S. Cl. .......................... 355/53; 355/72
(58) Field of Classification Search .......... 355/53, 355/72, 77
See application file for complete search history.

(56) References Cited

U.S. PATENT DOCUMENTS

| | | | |
|---|---|---|---|
| 4,780,617 A | 10/1988 | Umatate et al. | |
| 5,225,686 A | 7/1993 | Edo | |
| 5,448,332 A | 9/1995 | Sakakibara et al. | |
| 5,528,027 A * | 6/1996 | Mizutani | 250/234 |
| 5,646,413 A | 7/1997 | Nishi | |
| 5,969,441 A | 10/1999 | Loopstra et al. | |
| 6,262,796 B1 | 7/2001 | Loopstra et al. | |
| 6,341,007 B1 | 1/2002 | Nishi et al. | |
| 6,611,316 B2 | 8/2003 | Sewell | |
| 6,778,257 B2 | 8/2004 | Bleeker et al. | |
| 6,897,963 B1 | 5/2005 | Taniguchi et al. | |
| 7,023,610 B2 | 4/2006 | Ohtsuki et al. | |
| 2003/0098959 A1 | 5/2003 | Hagiwara et al. | |
| 2006/0121364 A1 | 6/2006 | Omura | |
| 2006/0231206 A1 | 10/2006 | Nagasaka et al. | |

FOREIGN PATENT DOCUMENTS

| | | |
|---|---|---|
| EP | 1 420 298 A2 | 5/2004 |
| JP | A-61-044429 | 3/1986 |
| JP | A-01-214021 | 8/1989 |
| JP | A-04-120716 | 4/1992 |
| JP | A-06-283403 | 10/1994 |

(Continued)

OTHER PUBLICATIONS

Apr. 10, 2007 Written Opinion issued in Application No. PCT/JP2006/326249 (with English translation).

(Continued)

*Primary Examiner* — Peter B Kim
(74) *Attorney, Agent, or Firm* — Oliff & Berridge, PLC

(57) ABSTRACT

In a measurement zone that is spaced apart in a Y-axis direction from an exposure zone that is located immediately below a projection unit, a detection area of an alignment system is moved in the Y-axis direction and a plurality of marks are sequentially detected, and therefore a movement distance of wafer stages in the Y-axis direction when performing the mark detection can be decreased compared with the case where only the wafer stages are moved while fixing the alignment system and mark detection is performed as in the conventional cases. Accordingly, a width of the measurement zone in the Y-axis direction can be reduced, which allows the apparatus to be downsized.

41 Claims, 14 Drawing Sheets

FOREIGN PATENT DOCUMENTS

| | | |
|---|---|---|
| JP | A-07-176468 | 7/1995 |
| JP | A-09-246150 | 9/1997 |
| JP | A-09-251952 | 9/1997 |
| JP | A-10-063011 | 3/1998 |
| JP | A-10-163097 | 6/1998 |
| JP | A-10-223528 | 8/1998 |
| JP | A-11-135400 | 5/1999 |
| JP | A-2000-505958 | 5/2000 |
| JP | A-2000-164504 | 6/2000 |
| JP | A-2000-511704 | 9/2000 |
| JP | B2-3303386 | 7/2002 |
| JP | 2003241396 A * | 8/2003 |
| JP | A-2003-347184 | 12/2003 |
| JP | A-2004-519850 | 7/2004 |
| JP | A-2006-005197 | 1/2006 |
| WO | WO 98/40791 A1 | 9/1998 |
| WO | WO 99/23692 A1 | 5/1999 |
| WO | WO 99/46835 A1 | 9/1999 |
| WO | WO 01/35168 A1 | 5/2001 |
| WO | WO 02/103766 A1 | 12/2002 |
| WO | WO 2004/053955 A1 | 6/2004 |
| WO | WO 2004/055803 A1 | 7/2004 |
| WO | WO 2004/057590 A1 | 7/2004 |
| WO | WO 2004/107011 A1 | 12/2004 |
| WO | WO 2005/029559 A1 | 3/2005 |
| WO | WO 2005/074014 A1 | 8/2005 |
| WO | WO 2006/038952 A2 | 4/2006 |

OTHER PUBLICATIONS

Nov. 29, 2011 Office Action issued in JP Application No. 2007-552986 (with English translation).

* cited by examiner

*Fig. 7A* *Fig. 7B* *Fig. 7C*
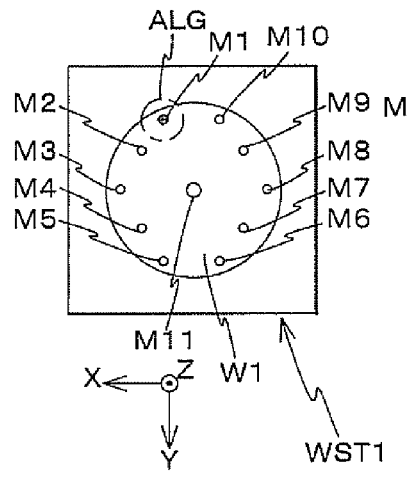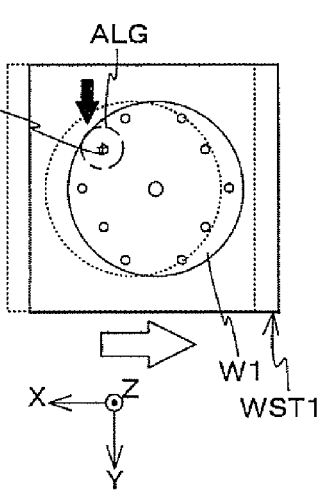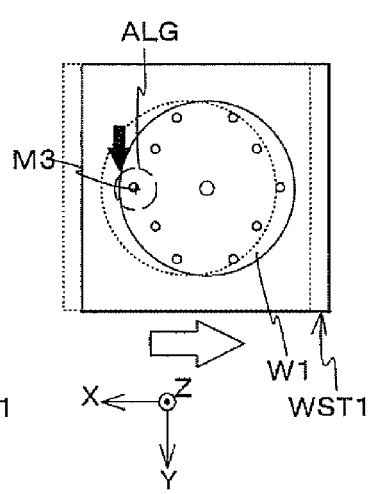
*Fig. 7D* *Fig. 7E* *Fig. 7F*
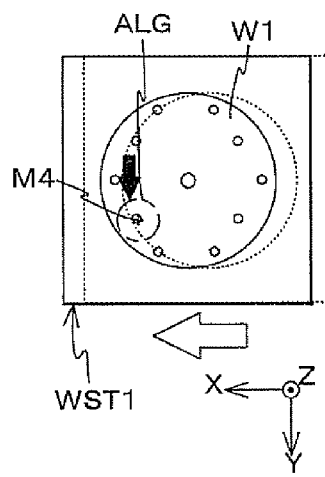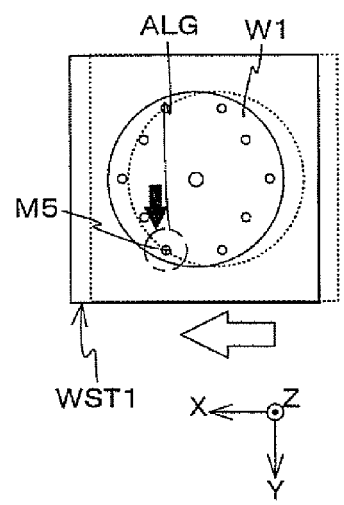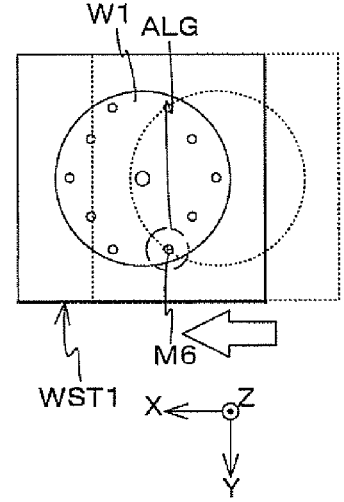

*Fig. 8A*  *Fig. 8B*  *Fig. 8C*
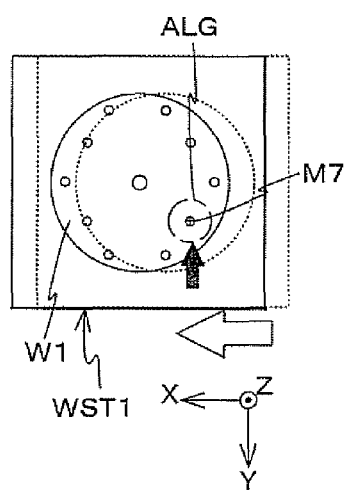 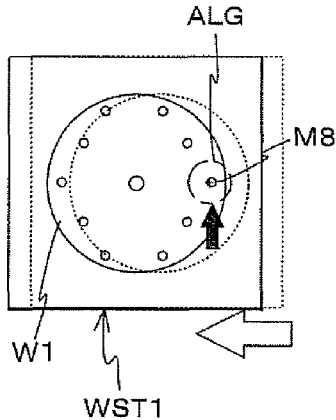 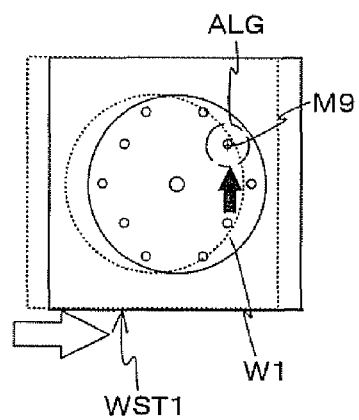
*Fig. 8D*  *Fig. 8E*
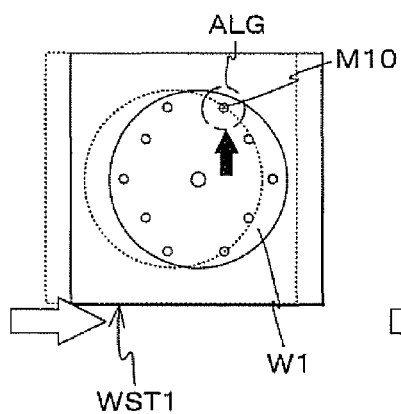 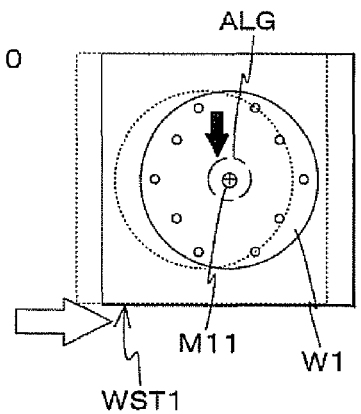

PATTERN FORMATION METHOD AND PATTERN FORMATION APPARATUS, EXPOSURE METHOD AND EXPOSURE APPARATUS, AND DEVICE MANUFACTURING METHOD

CROSS-REFERENCE TO RELATED APPLICATIONS

This application is a continuation of International Application PCT/JP2006/326249, with an international filing date of Dec. 28, 2006, the disclosure of which is hereby incorporated herein by reference in its entirety, which was not published in English.

BACKGROUND OF THE INVENTION

1. Field of the Invention

The present invention relates to pattern formation methods and pattern formation apparatuses, exposure methods and exposure apparatuses, and device manufacturing methods, and more particularly to a pattern formation method and a pattern formation apparatus that form a pattern on an object mounted on a movable body, an exposure method and an exposure apparatus that expose an object, and a device manufacturing method that uses the pattern formation method and the exposure method.

2. Description of the Background Art

In a lithography process for manufacturing microdevices (electronic devices) such as semiconductor devices, liquid crystal display devices or the like, an exposure apparatus, which forms a pattern on a substrate that is coated with a resist or the like, for example, a photosensitive object (hereinafter, generally referred to as a wafer) such as a wafer, a glass plate or the like, is used.

Because the semiconductor device or the like is formed by overlaying a plurality of layers of patterns on a wafer, an operation (an alignment) that makes the relative positional relation between a pattern that has been already formed on the wafer and a pattern image optimal is necessary for the exposure apparatus. As a method of the alignment, the EGA (Enhanced Global Alignment) method is mainly used. In the EGA method, the following procedures are employed: (1) a plurality of specific shot areas (which are also called sample shot areas or alignment shot areas) on a wafer are selected in advance; (2) positional information of alignment marks (sample marks) arranged in the sample shot areas are sequentially measured; and (3) a statistical computation by the least-squares method or the like is performed using the measurement result and alignment information in design of the shot areas, and array coordinates of the shot areas on the wafer are obtained. Therefore, in the EGA method, the array coordinate of each shot area can be obtained with high throughput and relatively high accuracy (refer to Kokai (Japanese Unexamined Patent Application Publication) No. 61-044429).

In the alignment described above, alignment marks arranged in a plurality of sample shot areas are measured. Accordingly, a wafer needs to be moved along a route with which a plurality of alignment marks are sequentially positioned within a detection area (a detection field) of a mark detection system (an alignment detection system). Therefore, separately from a movement area of the wafer required for the time when exposure is performed, a movement area of the wafer required for the time when the alignment is performed has to be secured below the mark detection system. In particular, in the case where the exposure position and the alignment system are placed spaced apart, the range in which the movement area for the exposure time and the movement area for the alignment time overlap is narrow, and accordingly the relatively large movement area as a whole of the wafer needs to be secured.

Further, conventionally, a wafer alignment operation (a measurement operation of sample marks) was performed prior to starting exposure of the wafer. Therefore, when the number of sample shot areas increases, the measurement takes a considerable amount of time, which could lead to the reduction in throughput of the entire exposure apparatus. From such a viewpoint, recently, a stage device based on a so-called twin-stage method, which aims at improving the throughput of the entire exposure process by preparing two wafer stages and carrying out the parallel processing in which while performing exposure at one of the wafer stages, alignment is performed at the other of the wafer stages, has been developed and has been employed in the exposure apparatus.

However, in the case of employing the stage device based on a twin-stage method, while one of the wafer stages moves within a two-dimensional plane and exposure is performed, the other of the wafer stages moves within the two-dimensional plane and alignment is performed, and therefore collision between the wafer stages needs to be prevented while both stages are operating.

As a method to realize the prevention, it is considered that a movement area in which one of the stages moves while performing exposure and a movement area in which the other of the stages moves while performing alignment are severally set so that the movement areas do not overlap. Due to this setting, however, the movement area of each stage widens, which could lead to the increase in the footprint and therefore to the increase in size of the apparatus.

SUMMARY OF THE INVENTION

The present invention was made under the circumstances described above, and according to a first aspect of the present invention, there is provided a pattern formation method of forming a pattern on an object in a predetermined pattern formation zone, the method comprising: a mark detection process of, in a mark detection zone that is spaced apart from the pattern formation zone in at least a predetermined direction within a two-dimensional plane, moving a detection area of a mark detection system in at least the predetermined direction and detecting a mark placed on the object, the mark detection system performing mark detection of the mark on the object; and a pattern formation process of moving the object in the pattern formation zone based on a mark detection result in the mark detection process and forming a pattern on the object.

With this method, in the mark detection process, in the mark detection zone that is spaced apart from the pattern formation zone in at least the predetermined direction within a two-dimensional plane, a detection area of the mark detection system that performs mark detection of the mark on the object is moved in at least a predetermined direction and a mark placed on the object is detected, and therefore a movement distance of the movable body in the predetermined direction when performing the mark detection can be reduced.

According to a second aspect of the present invention, there is provided a first exposure method of exposing an object, the method comprising: moving a detection area of a mark detection system in a first direction and detecting a plurality of marks on the object, in a measurement zone whose position in at least the first direction is different from an exposure zone where exposure of the object is performed; and moving the object in the exposure zone using a detection result of the marks.

With this method, in the measurement zone whose position in at least a first direction is different from the exposure zone, a detection area of the mark detection system that performs detection of the marks on the object is moved in the first direction and the marks placed on the object are detected, and therefore a movement distance of the movable body in the first direction when performing the mark detection can be reduced.

According to a third aspect of the present invention, there is provided a second exposure method of exposing an object, the method comprising: detecting a plurality of marks on the object by a mark detection system that has a plurality of detection areas whose positions are different in a first direction, in a measurement zone whose position in at least the first direction is different from an exposure zone where exposure of the object is performed; and moving the object in the exposure zone using a detection result of the marks.

With this method, a plurality of marks on the object are detected by a mark detection system that has a plurality of detection areas whose positions are different in a first direction in the measurement zone whose position in at least the first direction is different from the exposure zone, and therefore the measurement of the plurality of marks can be performed in a short period of time.

According to a fourth aspect of the present invention, there is provided a device manufacturing method, including a process of forming a pattern on an object using the pattern formation method of the present invention or the exposure method of the present invention.

According to a fifth aspect of the present invention, there is provided a pattern formation apparatus that forms a pattern on an object in a predetermined pattern formation zone, the apparatus comprising: a movable body that moves holding the object; a mark detection system that detects a plurality of marks on the object in a mark detection zone that is spaced apart from the pattern formation zone in at least a predetermined direction within a two-dimensional plane; and a controller that moves a detection area of the mark detection system in at least the predetermined direction and sequentially detects the plurality of marks, and moves the movable body in the pattern formation zone based on a result of the detection and forms a pattern on the object.

With this apparatus, in the mark detection zone that is spaced apart from the pattern formation zone in at least a predetermined direction within the two-dimensional plane, the controller moves a detection area of the mark detection system in at least the predetermined direction and sequentially detects a plurality of marks. Accordingly, compared with the case where only the movable body is moved with the mark detection system being fixed and mark detection is performed as in the conventional cases, a movement distance of the movable body in the predetermined direction when performing the mark detection can be reduced. With this operation, since a distance in the predetermined direction of an area in which the movable body moves can be reduced, which allows the footprint to narrow, and therefore allows the apparatus to be downsized.

According to a sixth aspect of the present invention, there is provided a first exposure apparatus that exposes an object, the apparatus comprising: a movable body that moves holding the object; a mark detection system that detects a plurality of marks on the object in a measurement zone whose position in at least a first direction is different from an exposure zone where exposure of the object is performed; and a controller that moves a detection area of the mark detection system in the first direction and detects the plurality of marks on the object using the mark detection system, and also controls movement of the movable body holding the object in the exposure zone using a detection result of the marks by the mark detection system.

With this apparatus, a detection area of the mark detection system that performs detection of the marks on the object is moved in a first direction and the marks placed on the object are detected in the measurement zone whose position in at least the first direction is different from the exposure zone, and therefore a movement distance of the movable body in the first direction when performing the mark detection can be reduced. This makes it possible to downsize the exposure apparatus.

According to a seventh aspect of the present invention, there is provided a second exposure apparatus that exposes an object, the apparatus comprising: a movable body that moves holding the object; a mark detection system that has a plurality of detection areas whose positions are different in a first direction and detects a plurality of marks on the object in a measurement zone whose position in at least the first direction is different from an exposure zone where exposure of the object is performed; and a controller that controls movement of the movable body holding the object in the exposure zone, using a detection result of the marks.

With this apparatus, in the measurement zone whose position in at least a first direction is different from the exposure zone, a plurality of marks on the object are detected by the mark detection system that has a plurality of detection areas whose positions are different in the first direction, and therefore the measurement of the plurality of marks can be performed in a short period of time, which makes it possible to improve the throughput of the exposure apparatus.

BRIEF DESCRIPTION OF THE DRAWINGS

In the accompanying drawings;

FIGS. 7A to 7F are views (No. 1) used to explain a drive method of wafer stage WST1 and the alignment system when performing alignment to a wafer on the wafer stage;

FIGS. 8A to 8E are views (No. 2) used to explain a drive method of wafer stage WST1 and the alignment system when performing alignment to a wafer on the wafer stage;

DESCRIPTION OF THE EMBODIMENTS

An embodiment of the present invention will be described below, referring to FIGS. 1 to 11.

Figure 1:
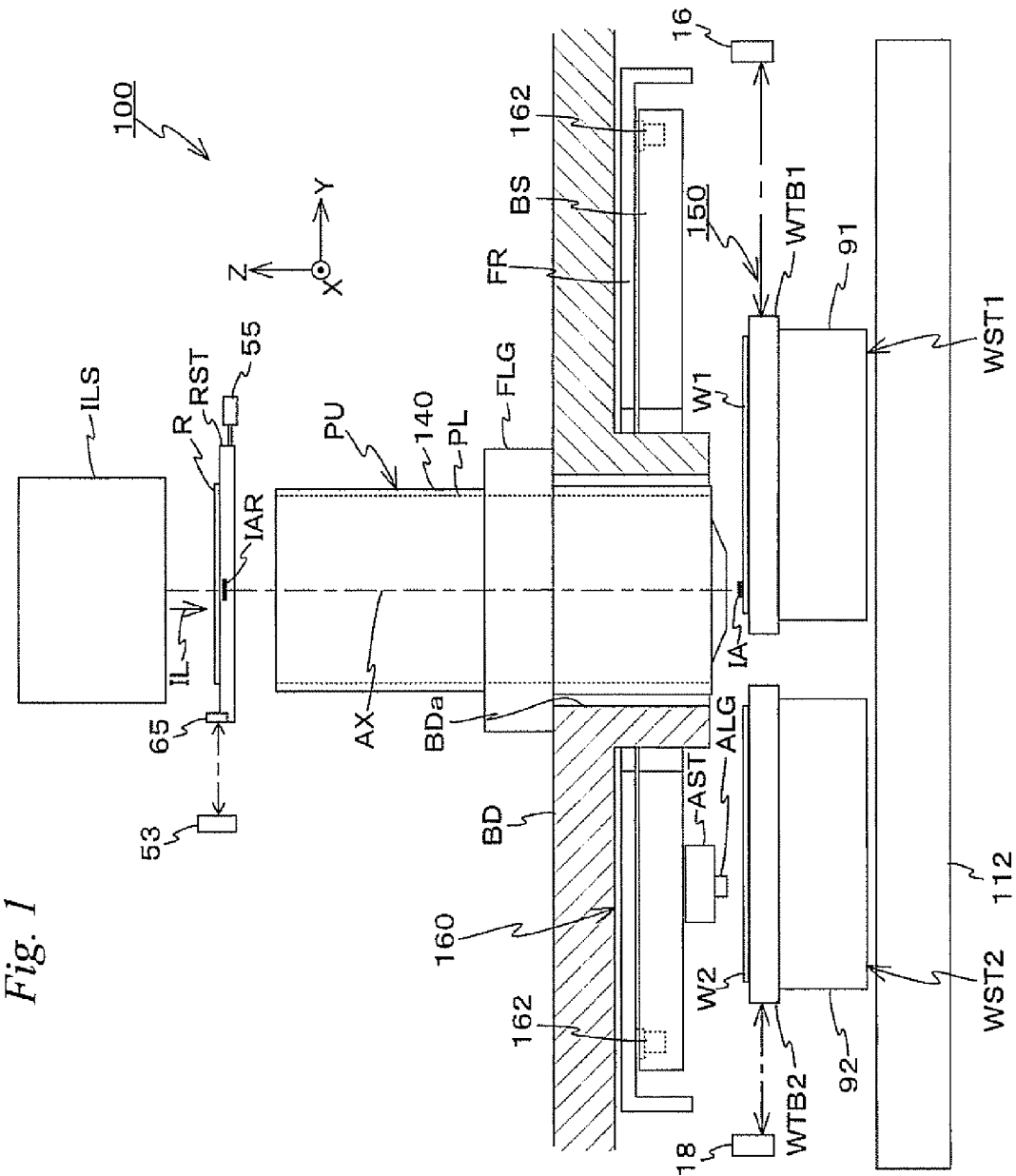
FIG. 1 is a schematic view showing an exposure apparatus related to an embodiment.

FIG. 1 schematically shows a configuration of an exposure apparatus 100 related to the embodiment. Exposure apparatus 100 is a scanning exposure apparatus based on a step-and-scan method, that is, a so-called scanner.

Exposure apparatus 100 includes an illumination system ILS that irradiates an illumination light for exposure (hereinafter, referred to as an illumination light or an exposure light) IL to an illumination area IAR on a reticle R, a reticle stage RST that holds reticle R, a projection unit PU including a projection optical system PL that projects illumination light IL emitted from reticle R onto a wafer W, a stage device 150 that includes wafer stages WST1 and WST2 on which wafers W1 and W2 are mounted respectively, an alignment system ALG, a drive device (hereinafter, referred to as an alignment system stage device) 160 serving as an actuator that drives alignment system ALG within a two-dimensional plane (an XY plane), a main controller 50 (not shown in FIG. 1, refer to FIG. 4) serving as a control system that performs overall control of operations of the entire exposure apparatus, and the like. In the following description, a Z-axis will be set along a direction (a vertical direction in the page surface of FIG. 1) parallel to an optical axis AX of projection optical system PL, a Y-axis will be set along a predetermined scanning direction (a lateral direction in the page surface of FIG. 1) in which reticle R and wafer W are synchronously moved within a plane perpendicular to the Z-axis when performing scanning exposure, and an X-axis will be set along a non-scanning direction (a direction perpendicular to the page surface of FIG. 1) that is orthogonal to the scanning direction. Further, rotational (inclination) directions around the X-axis, the Y-axis and the Z-axis are assumed to be a θx direction, a θy direction and a θz direction respectively.

Incidentally, a pattern is formed in each of the plurality of shot areas disposed in a matrix shape on wafer W, and in each shot area an alignment mark is also formed in a predetermined positional relation with the pattern. In the embodiment, the alignment mark is a two-dimensional mark, and includes, for example, two one-dimensional patterns periodically disposed in X-axis and Y-axis directions respectively, and also is formed on a street line (a scribe line) that divides the plurality of shot areas on wafer W. Further, alignment information of the shot areas (including the alignment marks) on wafer W is stored in a memory of main controller 50 as shot map data. In the embodiment, the EGA method described above is employed, therefore, from among the plurality of shot areas on wafer W, information on the position, the number and the like of the shot areas that have the alignment marks to be detected (alignment shot data) is already input into main controller 50.

Illumination system ILS includes a light source and an illumination optical system. As the light source, an ArF excimer laser light source (output wavelength: 193 nm) is used as an example. The illumination optical system includes, for example, a beam shaping optical system, a rough energy adjuster, an optical integrator (a uniformizer, or a homogenizer), an illumination system aperture stop plate, a beam splitter, a relay lens, a reticle blind, a mirror for bending the optical path, a condenser (none of which are shown) and the like, which are placed in a predetermined positional relation. Incidentally, the configuration of illumination system ILS, the function of each optical member, and the like are disclosed in, for example, the pamphlet of International Publication No. 2002/103766 (and the corresponding U.S. Patent Application Publication No. 2003/0098959).

On reticle stage RST, reticle R having a pattern surface (the lower surface in FIG. 1) on which a circuit pattern and the like are formed is fixed by, for example, vacuum suction. Reticle stage RST is finely movable at least within the XY plane and also drivable at designated scanning velocity in a predetermined scanning direction (the Y-axis direction) by a reticle stage drive system 55 including, for example, a linear motor or the like.

Positional information of reticle stage RST (including at least positional information in the X-axis direction, the Y-axis direction and the θy direction) is constantly detected at a resolution of, for example, around 0.5 to 1 nm by a reticle laser interferometer (hereinafter, referred to as a "reticle interferometer") 53 via a movable mirror 65 (in actual, a Y movable mirror having a reflection surface orthogonal to the Y-axis direction and an X movable mirror having a reflection surface orthogonal to the X-axis direction are arranged). The measurement values of reticle interferometer 53 are sent to main controller 50. Based on the measurement values of reticle interferometer 53, main controller 50 controls the position (and the velocity) of reticle stage RST via reticle stage drive system 55. Incidentally, movable mirror 65 is not limited to a planar mirror but may include a corner cubic mirror (a retroreflector), or instead of fixing movable mirror 65 to reticle stage RST, for example, a reflection surface that is formed by mirror polishing the end surface (the side surface) of reticle stage RST can be used.

Projection unit PU is placed below reticle stage RST in FIG. 1. Projection unit PU is supported by a body (e.g. including a holding mechanism whose base member is supported by three or four support columns each having a vibration isolation unit) BD that is installed on a floor surface (or a base plate). Projection unit PU is inserted in an opening BDa formed at body BD, and is supported by body BD via a flange FLG. Projection unit PU includes a barrel 140 and projection optical system PL that has a plurality of optical elements held in a predetermined positional relation within barrel 140. As projection optical system PL, for example, a dioptric system that is composed of a plurality of lenses (lens elements) disposed along optical axis AX is used. Projection optical system PL is, for example, both-side telecentric, and has a predetermined projection magnification (e.g. ¼, ⅕ or ⅛ times). Therefore, when illumination area IAR on reticle R is illuminated by illumination light IL from illumination system ILS, illumination light IL passing through reticle R forms a reduced image of a circuit pattern (a reduced image of part of the circuit pattern) on reticle R within illumination area IAR on an area (hereinafter also referred to as an "exposure area" or a "projection area") IA, which is conjugate with illumination area TAR, on wafer W1 (or W2) which surface is coated with a resist, via projection optical system PL (projection unit PU). Incidentally, projection unit PU is to be mounted on body SD in the embodiment, but projection unit PU may also be supported in a suspended state with respect to a main frame that is placed above (on the +Z side of) body BD in FIG. 1, as is disclosed in, for example, the pamphlet of International Publication No. 2006/038952.

Figure 2:
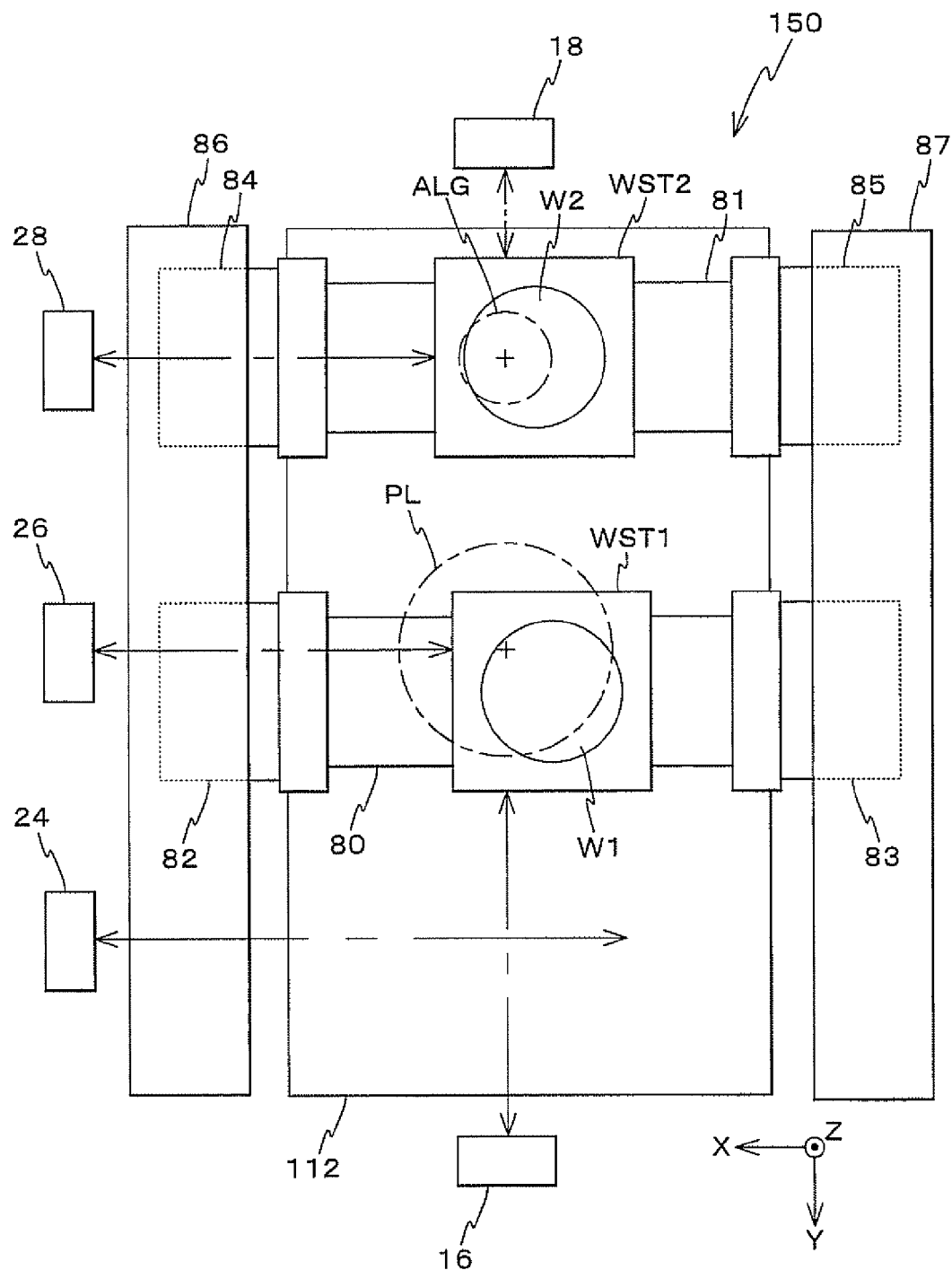
FIG. 2 is a plan view showing a stage device in FIG. 1.

As is shown in FIG. 1 and FIG. 2 that is a plan view of stage device 150, stage device 150 includes wafer stages WST1 and WST2 placed on a base board 112, an interferometer system 118 (refer to FIG. 4) that measures the positions (positional information) of wafer stages WST1 (wafer W1) and WST2 (wafer W2), and a stage drive system 124 (refer to FIG. 4) that drives wafer stages WST1 and WST2. Although not shown in the drawing, base board 112 is placed on a floor surface (or a base plate or the like), for example, via four vibration isolation units. Further, fiducial marks (not shown) are arranged on wafer stages WST1 and WST2 respectively.

On the bottom surface of each of wafer stages WST1 and WST2, a noncontact bearing (not shown), for example, an air bearing (which is also called an air pad) is arranged at a plurality of positions. Wafer stages WST1 and WST2 are supported by these air bearings via a clearance of around several μm above the upper surface of base board 112. Further, stages WST1 and WST2 are driven within the XY plane (including the θz rotation) independently from each other by stage drive system 124.

To be more specific, as is shown in FIG. 1, wafer stage WST1 includes a wafer stage main section 91 having the bottom surface on which the air bearing described above is arranged and a wafer table WTB1 that is mounted on wafer stage main section 91 via a Z-tilt mechanism (not shown, e.g. including an actuator such as a voice coil motor or the like) and is finely driven with respect to wafer stage main section 91 in the Z-axis direction, the θx direction and the θy direction. On wafer table WTB1, a wafer holder (not shown) that holds wafer W1 by vacuum suction or the like is arranged.

Similarly to wafer stage WST1, wafer stage WST2 includes a wafer stage main section 92 and a wafer table WTB2 that is mounted on wafer stage main section 92 via a Z-tilt mechanism (not shown) and is finely driven with respect to wafer stage main section 92 in the Z-axis direction, the θx direction and the θy direction. On wafer table WTB2, a wafer holder (not shown) that holds wafer W2 by vacuum suction or the like is arranged.

Next, stage drive system 124 will be described. As is shown in the plan view of FIG. 2, a pair of Y-axis stators 86 and 87 that extend in the Y-axis direction are placed on the +X-side and the −X-side of base board 112 respectively. Y-axis stators 86 and 87 are each configured of, for example, an armature unit having a plurality of coils placed at a predetermined distance along the Y-axis direction inside thereof. A pair of Y-axis movers 82 and 83 arranged at one end and the other end respectively in the longitudinal direction of an X-axis stator 80 that extends in the X-axis direction are engaged with Y-axis stators 86 and 87 respectively. Further, a pair of Y-axis movers 84 and 85 arranged at one end and the other end respectively in the longitudinal direction of an X-axis stator 81 that extends in the X-axis direction are engaged with Y-axis stators 86 and 87 respectively. Each of Y-axis movers 82 to 85 is configured of, for example, a magnetic pole unit having a plurality of permanent magnets placed at a predetermined distance along the Y-axis direction.

That is, four moving-magnet type Y-axis linear motors that drive Y-axis movers 82 to 85 in the Y-axis direction are respectively configured of Y-axis stator 86 and Y-axis mover 82, Y-axis stator 87 and Y-axis mover 83, Y-axis stator 86 and Y-axis mover 84, Y-axis stator 87 and Y-axis mover 85. In the following description, the four Y-axis linear motors are to be referred to as Y-axis linear motors 82 to 85 as needed, using the same reference signs as Y-axis movers 82 to 85 of the respective Y-axis linear motors. Incidentally, as the Y-axis linear motors, moving-coil type linear motors may also be employed.

Wafer stage WST1 is driven integrally with X-axis stator 80 in the Y-axis direction by two Y-axis linear motors 82 and 83 out of the four Y-axis linear motors described above, and wafer stage WST2 is driven integrally with X-axis stator 81 in the Y-axis direction by remaining two Y-axis linear motors 84 and 85. Further, wafer stages WST1 and WST2 are finely driven in the θz direction by two Y-axis linear motors, respectively.

Each of X-axis stators 80 and 81 is configured of, for example, an armature unit that incorporates armature coils placed at a predetermined distance along the X-axis direction. X-axis stator 80 is inserted in an opening (not shown) formed at wafer stage main section 91 (refer to FIG. 1) that constitutes wafer stage WST1. Inside the opening of wafer stage main section 91, for example, an X-axis mover (not shown) composed of, for example, a magnetic pole unit is arranged. That is, a moving-magnet type X-axis linear motor that drives wafer stage WST1 in the X-axis direction is configured of X-axis stator 80 and the X-axis mover. In the following description, the X-axis linear motor is referred to as X-axis linear motor 80 as needed, using the same reference sign as X-axis stator 80 serving as its stator.

Further, X-axis stator 81 is inserted in an opening (not shown) formed at wafer stage main section 92 (refer to FIG. 1) that constitutes wafer stage WST2. Inside the opening of wafer stage main section 92, for example, an X-axis mover (not shown) composed of a magnetic pole unit is arranged. That is, a moving-magnet type X-axis linear motor that drives wafer stage WST2 in the X-axis direction is configured of X-axis stator 81 and the X-axis mover. In the following description, the X-axis linear motor is referred to as X-axis linear motor 81, using the same reference sign as X-axis stator 81 serving as its stator.

Incidentally, as X-axis linear motors 80 and 81, moving-coil type linear motors may also be employed.

Figure 4:
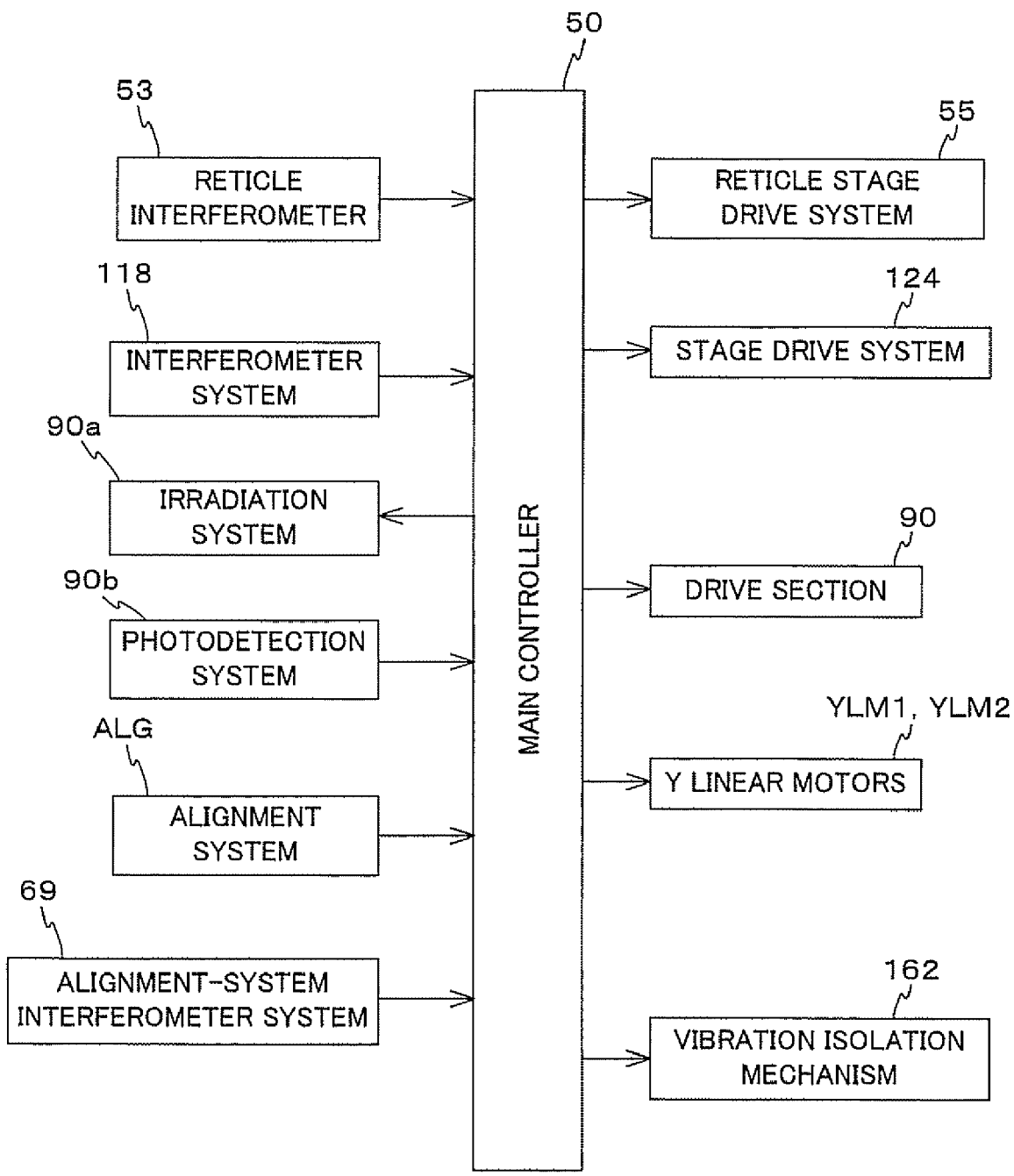
FIG. 4 is a block diagram showing a control system of the exposure apparatus related to the embodiment.

In the embodiment, stage drive system 124 shown in FIG. 4 is configured of Y-axis linear motors 82 to 85 and X-axis linear motors 80 and 81, and the Z-tilt mechanisms that wafer stages WST1 and WT2 respectively have. Each of the linear motors described above that constitute stage drive system 124 is controlled by main controller 50 shown in FIG. 4.

Positional information of wafer stage WST1 (wafer W1) and wafer stage WST2 (wafer W2) is constantly detected at a resolution of, for example, around 0.5 to 1 nm by interferometer system 118 shown in FIG. 4 via the side surfaces (the reflection surfaces that have been mirror-finished) of wafer tables WTB1 and WTB2. Interferometer system 118 includes a Y interferometer 16 used to detect the position of wafer stage WST1 in the Y-axis direction (including the position in the θz direction), a Y interferometer 18 used to detect the position of wafer stage WST2 in the Y-axis direction (including the position in the θz direction) and X interferometers 24, 26 and 28 used to detect the position of each stage in the X-axis direction, which are shown in FIG. 2, and a Z interferometer (not shown) used to detect the position of wafer table WTB1 in the Z-axis direction (including the position in the θx direction and the θy direction), and the like. The measurement values of interferometer system 118 are sent to main controller 50. Then, main controller 50 controls the position of each of stages WST1 and WST2 (and each of tables WTB1 and WTB2) and the like via stage drive system 124 based on the measurement values of interferometer system 118. In the embodiment, a coordinate system is set within the XY plane by interferometer system 118, and this coordinate system has an exposure coordinate system that is set by interferometers 26 and 16 (or 26 and 18), a first measurement coordinate system that is set by interferometers 24 and 16 and a second measurement coordinate system that is set by interferometers 28 and 18. Incidentally, instead of mirror-finishing the side surface of each table, a movable mirror may also be arranged at each table. Further, together with or instead of interferometer system 118, for example, a linear encoder or the like may detect the position of each of the stages.

Moreover, in exposure apparatus 100 of the embodiment, although not shown in the drawings such as FIG. 1, a multi-point focal position detection system based on an oblique incident method that is composed of an irradiation system 90a and a photodetection system 90b (refer to FIG. 4) attached to body BD that holds projection unit PU, which is similar to the one disclosed in, for example, Kokai (Japanese Unexamined Patent Application Publication) No. 06-283403 (the corresponding U.S. Pat. No. 5,448,332) and the like.

Alignment system ALG described above is an alignment system (a mark detection system) based on an off-axis method that has a detection area whose position is independently variable within a predetermined plane (the XY plane) perpendicular to optical axis AX of projection optical system PL. At least a partial section of alignment system ALG, for example, a partial section (including an objective optical system, a photodetection element, and the like) excluding the light source is movable by an alignment system stage device 160, in order to move the detection area within the predetermined plane.

As is shown in FIG. 1, alignment system stage device 160 includes a frame FR that is arranged separately from body BD vibrationwise, a platform BS that is arranged in a non-contact manner on the lower surface side of frame FR, an alignment system stage AST that supports alignment system ALG and moves within the XY plane taking the lower surface of platform BS as a movement reference surface.

Although not shown in the drawing, frame FR is supported at its four corner portions by a plurality of (e.g. four) support columns set up on a floor surface (or a base plate). Frame FR is composed of a member having a roughly U-shape when viewed from the −Z direction (refer to FIG. 3). Because frame FR has the roughly U-shape, mechanical interference with projection unit PU is avoided.

Platform BS is composed of a plate-shaped member having a roughly U-shape when viewed from the −Z direction (refer to FIG. 3), and has the lower surface (the surface on the −Z side) that has been processed so that its flatness becomes very high. Platform BS is supported in a suspended state by frame FR via a plurality of (e.g. three) vibration isolation mechanisms 162. Vibration isolation mechanism 162 includes, for example, a support device that has a piston and a cylinder and supports the self weight of platform BS by utilizing the pressure of gas in a gas room formed between the piston and the cylinder, and a voice coil motor that drives the piston of the support device. Since platform BS also has a roughly U-shape similar to frame FR, mechanical interference with projection unit PU is avoided.

Figure 3:
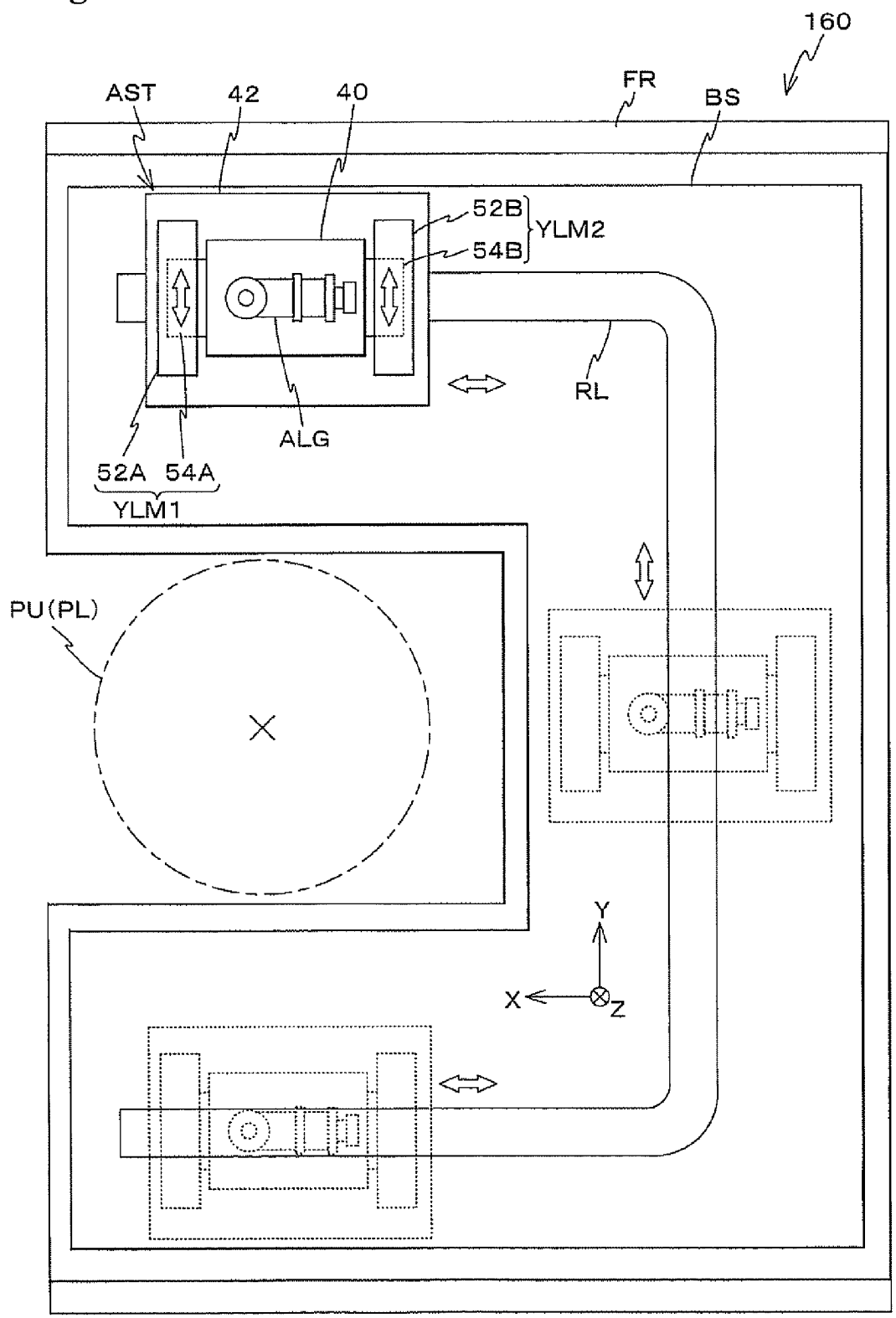
FIG. 3 is a view showing a configuration of an alignment system stage device.

FIG. 3 shows a state of alignment system stage device 160 when viewed from the −Z direction. As is shown in FIG. 3, alignment system stage AST includes a movable stage 42 that can move along a rail RL arranged in a U-shape on the lower surface (the surface on the −Z side) of platform BS, and a Y stage 40 that can move in the Y-axis direction with respect to movable stage 42.

Movable stage 42 has a rectangular shape in a planar view (when viewed from below), and on its upper surface (the surface on the side of depth of the page surface of FIG. 3), a drive section 90 (not shown in FIG. 3, refer to FIG. 4) that is engaged with rail RL is arranged. Due to drive section 90, movable stage 42 can move between the +Y side and the −Y side of projection unit PU while maintaining the attitude within the XY plane.

Y stage 40 is driven along the Y-axis by a pair of Y linear motors YLM1 and YLM2, which include a pair of Y-axis stators 52A and 52B that are fixed to the lower surface (the surface on the −Z side) of movable stage 42 and have the longitudinal direction in the Y-axis direction, and a pair of Y-axis movers 54A and 54B that are fixed to an end portion on the −X side and an end portion on the +X side of Y stage 40. Incidentally, as Y linear motors YLM1 and YLM2, either of a moving magnet type linear motor or a moving coil type linear motor may be employed.

Incidentally, within Y linear motor YLM1 (or YLM2), a voice coil motor that makes a drive force in the X-axis direction operate to Y stage 40 is also arranged, and it is possible to finely drive Y stage 40 in the X-axis direction. Further, by making the drive forces along the Y-axis of Y linear motors YLM1 and YLM2 different, it becomes possible to rotate and drive Y stage 40 in the θz direction.

Alignment system ALG includes an optical system containing an objective lens and the like, and an imaging device (e.g. CCD), and the like. A piping in which liquid flows is arranged on the periphery of a CCD that constitutes part of alignment system ALG, and the CCD is liquid-cooled by the liquid flowing in the piping. With this arrangement, the CCD can be placed close to the optical system containing the objective lens and the like, which reduces the size of alignment system ALG. Incidentally, the light source of alignment system ALG is not moved by alignment system stage AST and is arranged outside the alignment system stage and connected by an optical fiber or the like. Incidentally, the present invention is not limited thereto, but a relay optical system containing a mirror and the like that transmits a beam from the light source arranged outside to the optical system of alignment system ALG may also be used. Further, as alignment system ALG, other sensors by various methods can also be used. For example, a sensor that detects a diffracted light that is generated by alignment marks due to irradiation of a coherent laser beam may also be employed. Further, the cooling method of the CCD is not limited to the liquid-cooling but air-cooling may also be employed.

Incidentally, although not shown in the drawings such as FIG. 3, on the lower surfaces (the surfaces on the −Z side) of movable stage 42 and Y stage 40, various types of optical members (such as a prism, a mirror, and the like), which constitute an alignment-system interferometer system 69 (refer to FIG. 4) used to detect the position (positional information) of alignment system ALG within the XY plane, are placed.

Interferometer system 69 in the embodiment employs a double-pass method, and is to measure positional information in the X-axis and Y-axis directions and rotational information in the θx, θy and θz directions of alignment system stage AST (i.e. alignment system ALG).

Incidentally, in the embodiment, platform BS is supported by frame FR via vibration isolation mechanisms 162, but frame FR may be installed on a floor surface (or a base plate or the like) via vibration isolation mechanisms 162 and platform BS may only be fixed to frame FR. Further, in the embodiment, alignment system ALG and stage device 160 are arranged at frame FR, but in the case where exposure apparatus 100 has the configuration in which projection unit PU is supported in a suspended state with respect to the main frame as is described earlier, for example, alignment system ALG and stage device 160 may also be supported in a suspended state integrally with projection unit PU, or alignment system ALG and stage device 160 may also be arranged at a measurement frame that is supported in a suspended state by the main frame independently from projection unit PU. Moreover, at least part of alignment-system interferometer system 69 may be arranged together with alignment system ALG at the measurement frame.

In the embodiment, exposure apparatus 100 is equipped with: an exposure station that has an exposure zone in which the exposure coordinate system described above is set and wafer stages WST1 and WST2 are alternately carried, and performs exposure of a wafer with illumination light IL via projection optical system PL; a first measurement station that has a first measurement zone in which the first measurement coordinate system described above is set and wafer stage WST1 is placed, and performs detection of alignment marks on wafer W1 and the fiducial marks of wafer stage WST1 by alignment system ALG; and a second measurement station that has a second measurement zone in which the second measurement coordinate system described above is set and wafer stage WST2 is placed, and performs detection of alignment marks on wafer W2 and the fiducial marks of wafer stage WST2 by alignment system ALG. Positional information of wafer stage WST1 in the first measurement coordinate system is measured by interferometers 24 and 16 in the first measurement zone, and positional information of wafer stage WST1 in the exposure coordinate system is measured by interferometers 26 and 16 in the exposure zone, and wafer stage WST1 is moved between the first measurement zone and the exposure zone by stage drive system 124. Positional information of water stage WST2 in the second measurement coordinate system is measured by interferometers 28 and 18 in the second measurement zone, and positional information of wafer stage WST2 in the exposure coordinate system is measured by interferometers 26 and 18 in the exposure zone, and wafer stage WST2 is moved between the second measurement zone and the exposure zone by stage drive system 124.

In the exposure station, not only an exposure operation but also, prior to the exposure operation, detection of reticle marks and the fiducial marks of the wafer stages by a reticle alignment system (not shown), which is disclosed in, for example, Kokai (Japanese Unexamined Patent Application Publication) No. 07-176468 (the corresponding U.S. Pat. No. 5,646,413), is performed. Based on the detection result (the positional relation between a projection position of the reticle marks and the fiducial marks in the exposure coordinate system) and the detection result of alignment system ALG, main controller 50 moves the wafer stage in the exposure zone. In each of the first and second measurement stations, not only a measurement operation (including the mark detection described above) but also loading of a wafer to the wafer stage and unloading of a wafer on the wafer stage (wafer exchange) are performed at a predetermined position in the first or second measurement zone. Incidentally, the loading position and the unloading position in each measurement zone may be made to be different, or the loading position and/or the unloading position do/does not have to be set in each measurement zone.

The exposure zone includes a movement area L (refer to FIG. 10) of the wafer stage in the exposure operation and the detection operation of the fiducial marks, and the first and second measurement zones respectively include movement areas B and A of the wafer stage in the detection operation of the alignment marks and the fiducial marks (which also includes a wafer exchange operation, in the embodiment). In the embodiment, in at least the Y-axis direction, the width of the exposure zone is equal to the width of the movement area L and also the widths of the first and second measurement zones are respectively equal to the widths of movement areas B and A. Further, the exposure zone (movement area L) and the first measurement zone (movement area B), or the exposure zone (movement area L) and the second measurement zone (movement area A) may partially overlap in the Y-axis direction, but in the embodiment, the exposure zone and the first and second measurement zones are set within the XY plane without overlapping.

FIG. 4 shows a block diagram of a main configuration of the control system in exposure apparatus 100 of the embodiment. The control system in FIG. 4 includes a so-called microcomputer (or workstation) that is composed of a CPU (Central Processing Unit), an ROM (Read Only Memory), an RAM (Random Access Memory) and the like, and is mainly configured of main controller 50 that performs overall control of the entire apparatus.

Next, a parallel processing operation using wafer stage WST1 and wafer stage WST2 in exposure apparatus 100 will be described in detail, referring to FIGS. 5A to 9. Incidentally, although control of respective sections is performed by main controller 50, the description regarding the control except for the necessary parts will be omitted in order to avoid complication of the description. Further, a basic control operation of exposure apparatus 100 including the parallel processing operation is disclosed in, for example, the U.S. Pat. No. 6,341,007 and the like.

Further, the relation between a coordinate system of alignment-system interferometer 69 that measures the position of alignment system ALG and a coordinate system of interferometer system 118 that measures the positions of wafer stages WST1 and WST2 is measured beforehand using the fiducial marks or the like on the wafer stages. In the embodiment, for example, the position of alignment system ALG is set at a reference position of the coordinate system of interferometer system 96, and detection of the fiducial marks of the wafer stage by alignment system ALG is performed. Then, based on positional information of the fiducial marks within the detection area obtained by alignment system ALG and the positions of alignment system ALG and the wafer stage obtained by interferometer systems 69 and 118, the positions of alignment system ALG and the wafer stage at the time when the detection center of alignment system ALG and the fiducial mark coincide (in other words, the position of the detection center of alignment system ALG in the coordinate system of interferometer system 118) are obtained. With this operation, the relation between the coordinate system of interferometer system 69 and the coordinate system of interferometer system 113 is determined, that is, the relation between the coordinate system of interferometer system 69 and the first measurement coordinate system of interferometers 24 and 16, and the relation between the coordinate system of interferometer system 69 and the second measurement coordinate system of interferometers 28 and 18 are determined. In the embodiment, based on the determined relations, the shot map data described above (including alignment shot data), and the measurement values of interferometer systems 69 and 118, alignment system ALG and the wafer stage are moved in each measurement station (each measurement zone) and detection of alignment marks on the wafer is performed.

Figure 5A:
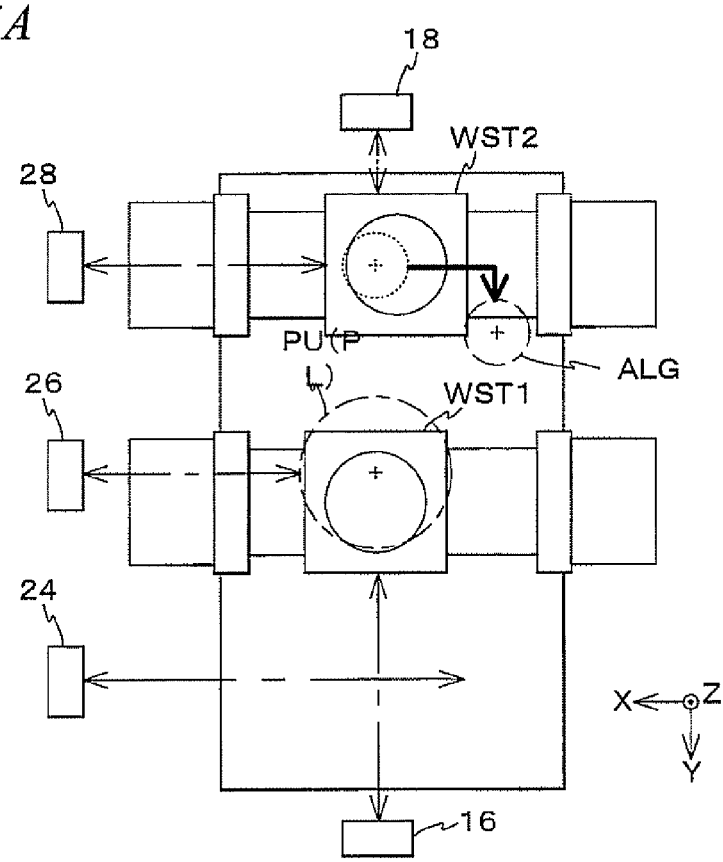
FIGS. 5A and 5B are views (No. 1) used to explain a parallel processing operation by wafer stages WST1 and WST2.

FIG. 5A shows a state where an alignment operation (to be described in detail later on) of a wafer on wafer stage WST2 has ended and an exposure operation to a wafer on wafer stage WST1 is being performed. When performing the exposure operation, the position of wafer stage WST1 is measured by X interferometer 26 and Y interferometer 16, and the position of wafer stage WST2 is measured by X interferometer 28 and Y interferometer 18.

When the exposure operation to the wafer on wafer stage WST1 ends, from this state, wafer stage WST1 moves to the +Y direction and wafer stage WST2 moves to the +Y direction. That is, wafer stage WST1 moves from the exposure station (the exposure zone) to the first measurement station (the first measurement zone), and wafer stage WST2 moves from the second measurement station (the second measurement zone) to the exposure station. Incidentally, wafer stage WST2 may also move to the vicinity of wafer stage WST1 before the exposure operation ends.

In this case, an interferometer used for position measurement related to the X-direction of wafer stage WST1 is switched from X interferometer 26 to X interferometer 24 according to movement of wafer stage WST1, and in the case where both the measurement axes of X interferometers 26 and 24 become out of wafer stage WST1 in the middle of the movement, the X position of wafer stage WST1 may also be measured using, for example, an encoder or the like. Further, an interferometer used for position measurement in the X-direction of wafer stage WST2 is switched from X interferometer 28 to X interferometer 26 according to movement of wafer stage WST2, and in the case where both the measurement axes of X interferometers 28 and 26 become out of wafer stage WST2 in the middle of the movement, the position of wafer stage WST2 may also be measured using, for example, an encoder or the like.

Figure 5B:
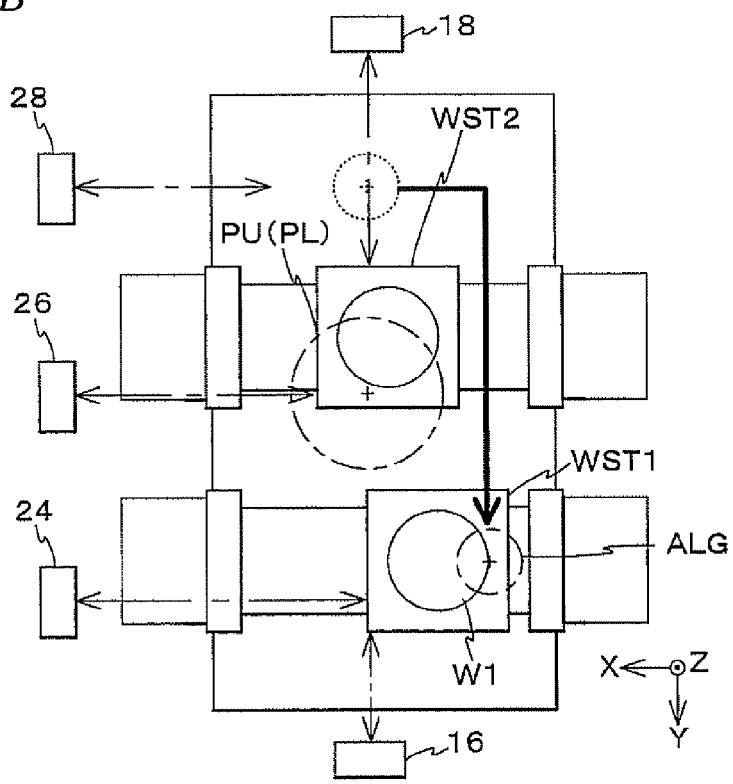

Then, in the first measurement station, when wafer stage WST1 reaches the position shown in FIG. 5B, exchange of the wafer on wafer stage WST1 is performed via a wafer exchange device (not shown). Hereinafter, a wafer that is newly loaded on wafer stage WST1 in this wafer exchange is referred to as wafer W1. Meanwhile, in the exposure station, when the position of wafer stage WST2 is set just below projection unit PU (projection optical system PL), the exposure operation is started based on the detection result of the marks on a wafer by alignment system ALG, and the like. Incidentally, since exposure based on a step-and-scan method similar to the conventional exposure is performed in the exposure station, the detailed description will be omitted.

Figure 6:
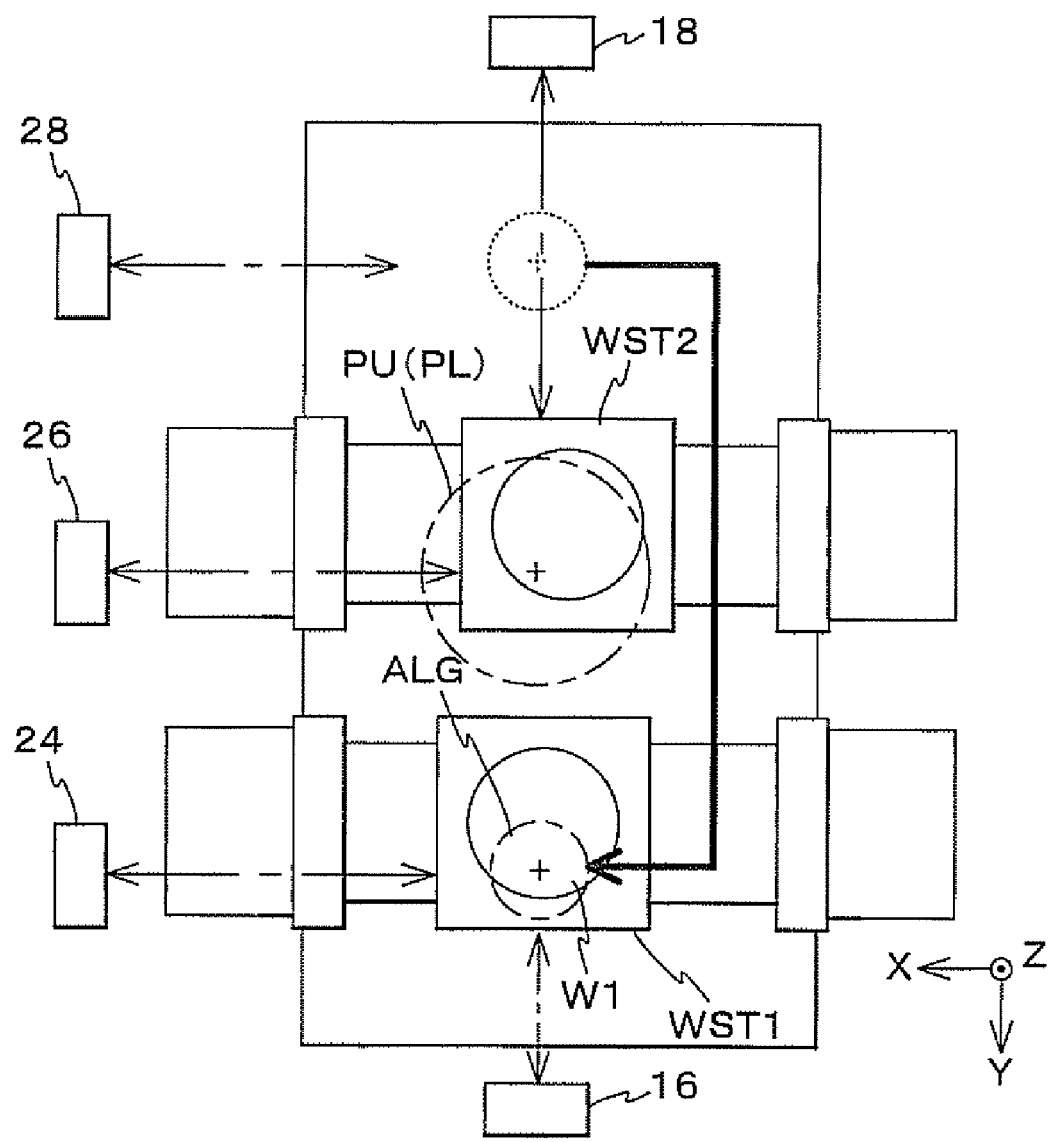
FIG. 6 is a view (No. 2) used to explain a parallel processing operation by wafer stages WST1 and WST2.

Further, alignment system ALG moves from the second measurement station to the first measurement station in parallel with the movement of wafer stages WST1 and WST2. That is, during the period from when the alignment operation of the wafer on wafer stage WST2 ends until when the wafer exchange at wafer stage WST1 ends, alignment system ALG moves from a second measurement position indicated by a dotted line in FIG. 5A to a first measurement position indicated by a dashed-dotted line in FIG. 6 (a position in which the detection area of alignment system ALG is away from the projection center or projection optical system PL to the +Y side) after passing through the positions indicated by a dashed-dotted line in FIG. 5A and FIG. 5B. Then, when the wafer exchange ends on wafer stage WST1, as is shown in FIG. 6, wafer stage WST1 moves to a location immediately below alignment system ALG.

In the first measurement station, as is shown in FIGS. 7A to 8E, movement of the detection area of alignment system ALG in the Y-axis direction and movement of wafer stage WST1 in the X-axis direction are performed, and detection of the alignment marks on wafer W1 using alignment system ALG is carried out. Further, detection of the fiducial marks on wafer stage WST1 is also performed, and positional information of the alignment marks and the fiducial marks is stored in a memory of main controller 50. Incidentally, in the embodiment, detection of positional information of eleven alignment marks M1 to M11 on wafer W1 is performed, and before carrying out the detection, search alignment using search alignment marks (not shown) may also be performed.

First of all, as is shown in FIG. 7A, detection of a first alignment mark M1 is carried out. Main controller 50 changes the relative position within the XY plane between wafer stage WST1 and the detection area of alignment system ALG, by moving wafer stage WST1 in the X-axis direction based on the measurement values of X interferometer 24 and Y interferometer 16 and also moving alignment system stage AST in the Y-axis direction based on the measurement value of alignment-system interferometer system 69, and sets alignment mark M1 within the detection area of alignment system ALG. Alignment system ALG outputs the detection signal (image data of alignment mark M1 within the detection area) to main controller 50.

Then, based on the positional relation between the center of the detection area of alignment system ALG and alignment mark M1, the measurement values of interferometers 24 and 16, the measurement value of interferometer system 69 and the relation between the coordinate system of interferometer system 69 and the first measurement coordinate system of interferometers 24 and 16, positional information of alignment mark M1 is detected.

When the detection of alignment mark M1 ends, as is shown in FIG. 7B, by moving wafer stage WST1 to the −X direction and also moving alignment system ALG to the +Y direction, a second alignment mark M2 is set within the detection area of alignment system ALG. Incidentally, in FIGS. 7A to 8E, the movement direction of wafer stage WST1 is indicated by a white arrow and the movement direction of alignment system ALG is indicated by a black arrow. Then, similarly to the detection of positional information (a coordinate value) of first alignment mark M1, positional information (a coordinate value) of second alignment mark M2 is detected. When this detection ends, as is shown in FIG. 7C, by moving wafer stage WST1 further to the −X direction and also moving alignment system ALG to the +Y direction, a third alignment mark M3 is set within the detection area of alignment system ALG. Then, when the detection of positional information (a coordinate value) of alignment mark M3 ends, the procedure proceeds to detection of positional information of a next alignment mark, a fourth alignment mark M4.

As is shown in FIGS. 7D and 7E, by performing movement of water stage WST1 to the +X direction and movement of alignment system ALG to the +Y direction, fourth alignment mark M4 and a fifth alignment mark M5 are set within the detection area of alignment system ALG and detection of positional information (a coordinate value) of each mark is carried out.

Then, when the detection of positional information of mark M5 ends, the procedure proceeds to detection of positional information of a sixth alignment mark M6. In this case, as is shown in FIG. 7F, by moving only wafer stage WST1 to the X-direction with the position of alignment system ALG being fixed, alignment mark M6 is set within the detection area of alignment system ALG, and detection of positional information (a coordinate value) of mark M6 is carried out.

After that, when detection of positional information of alignment mark M6 ends, the procedure proceeds to detection of positional information of the subsequent alignment marks, a seventh alignment mark M7 and an eighth alignment mark M8. In this case, as is shown in FIGS. 8A and 8B, by moving wafer stage WST1 to the +X direction and also moving alignment system ALG to the −Y direction, alignment marks M7 and M8 are set within the detection area of alignment system ALG, and detection of positional information (a coordinate value) of marks M7 and M8 is carried out.

Subsequently, detection of positional information (a coordinate value) of a ninth alignment mark M9 and a tenth alignment mark M10 is carried out. That is, as is shown in FIGS. 5C and 8D, by moving wafer stage WST1 to the −X direction and also moving alignment system ALG to the −Y direction, alignment marks M9 and M10 are set within the detection area of alignment system ALG. Then, finally, as is shown in FIG. 8E, by moving wafer stage WST1 to the −X direction and also moving alignment system ALG to the +Y direction, an eleventh alignment mark M11 located substantially at the center of wafer W1 is set within the detection area of alignment system ALG, and positional information (a coordinate value) of mark M11 is detected, thereby finishing the detection of positional information of the eleven alignment marks.

Incidentally, in the embodiment, after detecting positional information of one alignment mark, the movement of alignment system ALG and wafer stage WST1 for detecting the next alignment mark is to be started, but the movement of alignment system ALG and/or wafer stage WST1 may also be started at the time when the detection of the alignment mark by alignment system ALG ends. That is, the movement may be started without waiting for the detection end of the mark positional information. Further, detection of the fiducial marks of wafer stage WST1 by alignment system ALG may be performed either before/after the detection operation of the eleven alignment marks or in the middle of the detection operation, but it is preferable to perform the detection in the order with which the detection time of the alignment marks and the fiducial marks becomes shortest, and in the embodiment the detection of the fiducial marks is to be performed before the detection operation of the alignment marks.

When the eleven alignment marks have been detected as is described above, in the embodiment, by employing the EGA (Enhanced Global Alignment) method that is disclosed in, for example, Kokai (Japanese Unexamined Patent Application Publication) No. 61-044429 (the corresponding U.S. Pat. No. 4,780,617), main controller 50 performs a statistical computation by the least-squares method or the like using the detection results of the alignment marks (the coordinate values of the marks in the second measurement coordinate system) and the designed alignment information of shot areas, and computes the array coordinates of all the shot areas to which the exposure processing should be performed on wafer W1.

When the alignment operation ends as is described above, as is shown in FIG. 9, alignment system ALG starts movement toward the second measurement position (the position indicated by a dotted line in FIG. 5A) in the second measurement station. Further, wafer stage WST1 starts movement to the exposure station (to the location immediately below projection unit PU). During this movement, as an interferometer that detects the X-position of wafer stage WST1, interferometer 26 succeeds interferometer 24. Then, wafer stage WST1 is carried in the exposure station in exchange for wafer stage WST2.

Figure 9:
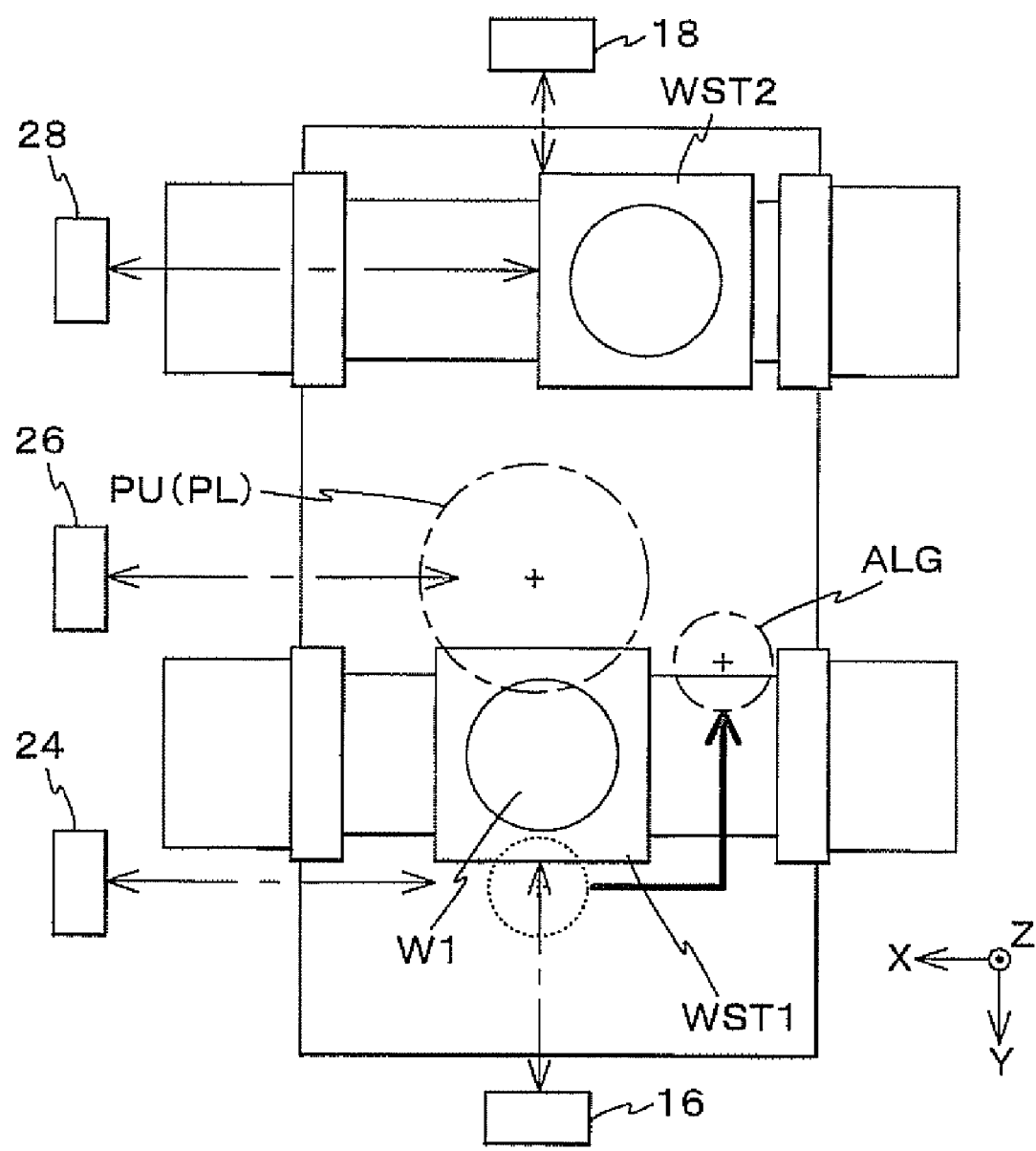
FIG. 9 is a view used to explain a parallel processing operation by wafer stages WST1 and WST2.

Meanwhile, when exposure to all the shot areas of wafer W2 on wafer stage WST2 ends in the exposure station, wafer stage WST2 starts movement to the −Y direction and the −X direction, and moves from the exposure station to the position shown in FIG. 9 in the second measurement station. Then, at this position, the wafer on wafer stage WST2 is exchanged via a wafer exchange device (not shown). Incidentally, during the movement of wafer stage WST2, as an interferometer that detects the X-position of wafer stage WST2, interferometer 28 succeeds interferometer 26. Then in the second measurement station, the alignment operation of the wafer on wafer stage WST2 is started using alignment system ALG that has returned to the second measurement position indicated by a dashed-dotted line in FIG. 2. This alignment operation is performed similarly to the procedures shown in FIGS. 7A to 8E.

Further, in the exposure station, detection of the fiducial marks of wafer stage WST1 by the reticle alignment system is performed in parallel with the wafer exchange operation and/or the alignment operation in the second measurement station, and main controller 50 obtains positional information of the fiducial marks (a coordinate value of the fiducial mark in the exposure coordinate system at the time when the projection position of the reticle mark and the fiducial mark coincide). Moreover, based on this coordinate value of the fiducial mark and the alignment result (the array coordinates of the shot areas on wafer W1 computed in the EGA method, and the coordinate value of the fiducial mark) in the second measurement station, the array coordinates of the shot areas on wafer W1 in the exposure coordinate system are determined. Then, by moving wafer stage WST1 based on the determined array coordinates, exposure to wafer W1 is carried out. Incidentally, because exposure based on a step-and-scan method similar to the conventional exposure is performed in this case, the detailed description will be omitted.

After that, exposure to a predetermined number of wafers (e.g. wafers in one lot) is sequentially performed by repeatedly performing the parallel operations described above.

Next, the different points between exposure apparatus 100 of the embodiment and a conventional exposure apparatus (e.g. the exposure apparatus described in Kokai (Japanese Unexamined Patent Application Publication) No. 10-163097 and the corresponding U.S. Pat. No. 6,341,007) will be described using FIG. 10 that shows stage device 150 that constitutes exposure apparatus 100 of the embodiment and FIG. 11 that shows a stage device 150' that constitutes the conventional exposure apparatus.

Figure 10:
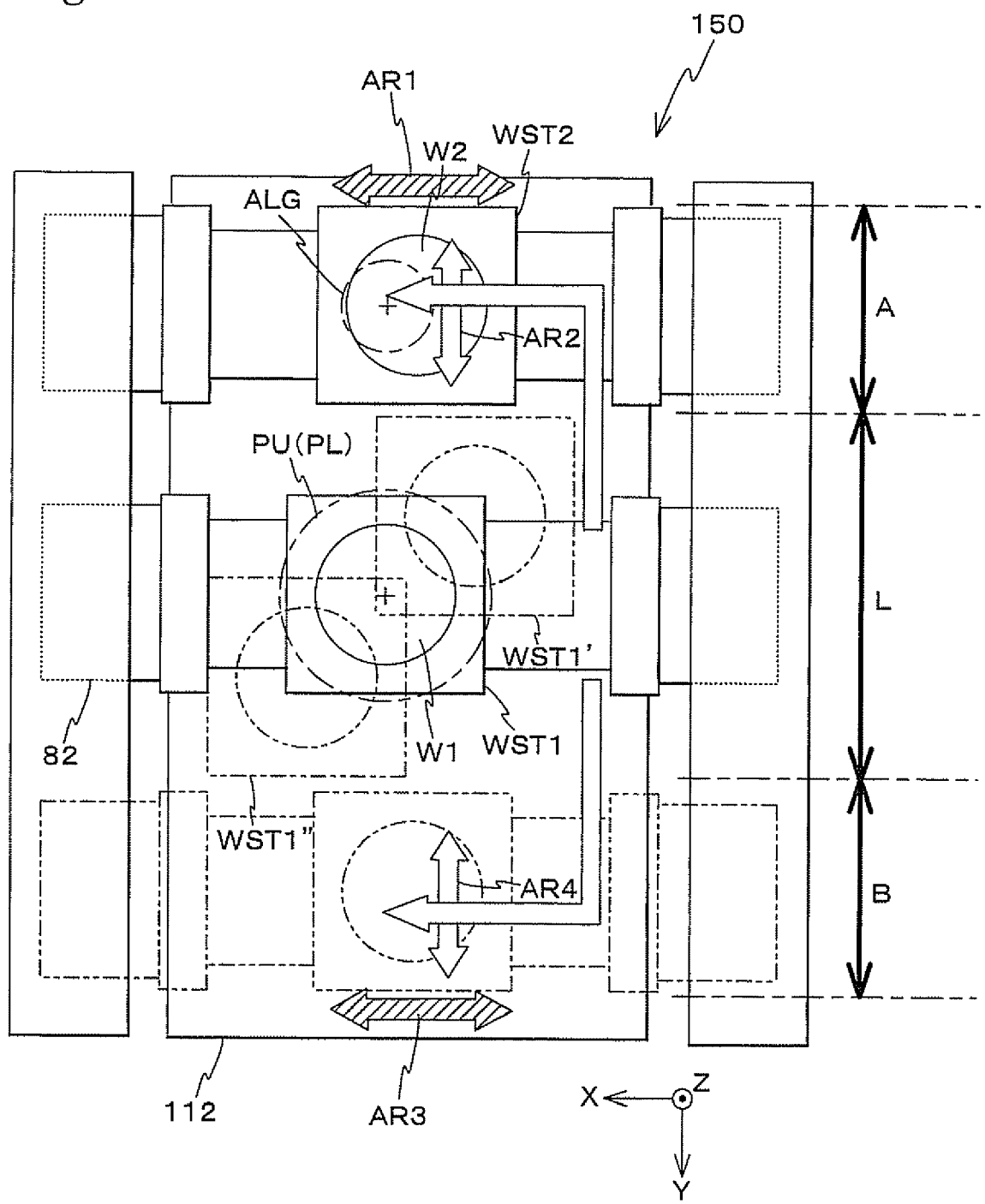
FIG. 10 is a view used to explain a movement area of wafer stages WST1 and WST2 in the embodiment.

FIG. 10 shows stage device 150 that constitutes exposure apparatus 100 of the embodiment. As is shown in FIG. 10, wafer stage WST1 located immediately below projection unit PU, that is, placed in the exposure station moves from the position of a reference sign WST1' indicated by a dashed-two dotted line to the position of a reference sign WST1" indicated by a dashed-two dotted line, at a maximum. Therefore, in stage device 150, the movement area of wafer stage WST1 needs to be secured at a location immediately below projection unit PU (refer to area L in FIG. 10). On the other hand, since exposure apparatus 100 employs the alignment method shown in FIGS. 7A to 8E described above, wafer stage WST2 located in the −Y direction of projection unit PU, that is, placed in the second measurement station moves only in the X-axis direction indicated by a left right arrow AR1, and alignment system ALG moves in the Y-axis direction indicated by an up down arrow AR2. Therefore, as the movement area of wafer stage WST2 in the Y-axis direction during the alignment, the width that is substantially the same as the width of wafer stage WST2 in the Y-axis direction only has to be secured (refer to area A in FIG. 10). Further, also when the alignment is performed at wafer stage WST1 (as is indicated by a dashed-two dotted line in FIG. 10), wafer stage WST1 moves only in the X-axis direction indicated by a right left arrow AR3 in the first measurement station and alignment system ALG moves in the Y-axis direction indicated by an up down arrow AR4. Therefore, as the movement area of wafer stage WST1 in the Y-axis direction during the alignment, the width that is substantially the same as the width of wafer stage WST1 in the Y-axis direction only has to be secured (refer to area B in FIG. 10).

Meanwhile, in stage device 150' that constitutes the conventional exposure apparatus shown in FIG. 11, the movement area of wafer stage WST1 or WST2 that should be secured immediately below projection unit PU (projection optical system PL) is the same (refer to area L in FIG. 11) as that in stage device 150 in FIG. 10. However, wafer stage WST1 (or WST2) needs to move two-dimensionally when the alignment by wafer stage WST1 (or WST2) is performed, and accordingly, an area (refer to area A' or B' in FIG. 11) that is substantially the same as the movement area required when performing exposure needs to be secured on the −Y side and the +Y side of projection optical system PL.

Figure 11:
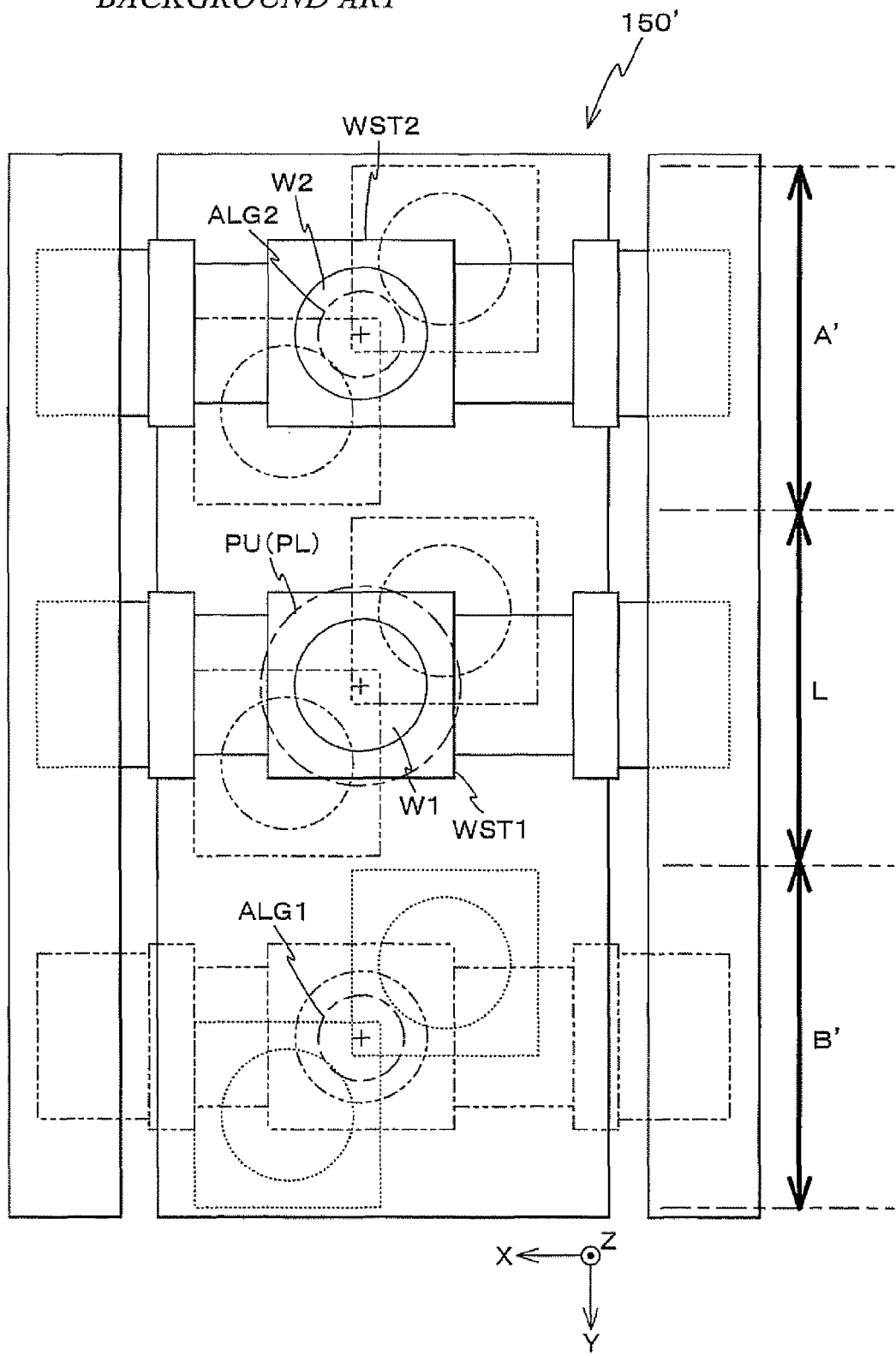
FIG. 11 is a view used to explain a movement area of wafer stages WST1 and WST2 in a conventional stage device.

As is obvious when comparing FIGS. 10 and 11, area A is narrower than area A' and area B is narrower than area B', and therefore the movement areas of the stages in stage device 150 of the embodiment can be smaller than those in conventional stage device 150'. This makes it possible to decrease the planar dimension of base board 112 and shorten the stroke of Y-axis linear motors 82 to 85. In this manner, since downsizing of the stage device can be realized in the embodiment, the footprint can be narrowed and therefore the exposure apparatus can be downsized.

Further, since the planar dimension of base board 112 can be decreased, the surface processing of base board 112 can be performed with high precision, and as a consequence, the movement of the stages can be performed with high accuracy.

As is described above, according to the embodiment, in the first and second measurement zones (movement areas B and A) of the first an second measurement stations, alignment system ALG is moved in the Y-axis direction while moving the wafer stage in the X-axis direction, and the mark detection by alignment system ALG is performed. Therefore, a movement distance of the wafer stage in the Y-axis direction when performing the detection can be shortened (can be zero in the embodiment), compared with the case of moving only the wafer stage two-dimensionally with alignment system ALG being fixed and performing the mark detection. Thus, since the size of the movement area of the wafer stage in the Y-axis direction required both when performing the exposure and when performing the detection can be reduced, the stage device can be downsized, and the footprint can be narrowed and therefore the exposure apparatus can be downsized.

Further, because alignment system ALG and wafer stage WST1 (or WST2) can be moved simultaneously, the movement time from when a mark subject to detection is detected until when a next mark subject to detection is detected (in particular, the movement time required in the case where these two marks are placed in a direction intersecting the X-axis and Y-axis) can be shortened. Therefore, the time required for the alignment can be shortened and the throughput of all the processes including the exposure process can be improved. Or, the number of alignment marks to be detected can be increased without increasing the alignment time, and the alignment (overlay) accuracy of the wafer can be improved.

Further, according to the embodiment, stage device 150 is a twin-stage type stage device that includes two wafer stages WST1 and WST2, and while the alignment is being performed at one wafer stage, exposure is performed at the other wafer stage, and therefore the throughput of the exposure apparatus can be improved, compared with the case of employing a stage device that includes only one wafer stage.

Further, according to the embodiment, although the alignment is performed in each of the first and second measurement stations in exposure apparatus 100, only one alignment system is to be used. Therefore, adjustment (or control) of aberration between alignment systems does not have to be performed, which is unlike the exposure apparatus in which alignment systems ALG1 and ALG2 are arranged in the first and second measurement stations respectively as is shown in FIG. 11. Accordingly, the time and labor for the adjustment between alignment systems can be omitted, and also the high precision mark detection can be realized.

Incidentally, in the embodiment described above, the case has been described where movement of wafer stage WST1 (WST2) in the Y-axis direction is made to be zero and only alignment system ALG is moved in the Y-axis direction when performing the alignment operation, but the present invention is not limited thereto, and both wafer stage WST1 (WST2) and alignment system ALG may also be moved in the Y-axis direction. Also in this case, the movement distance of wafer stage WST1 (WST2) in the Y-axis direction can be shorter than the conventional case, and downsizing of the apparatus can be realized. Further, for example, the movement range of wafer stages WST1 and WTS2 in the Y-axis direction on the alignment is set (the movement range narrower than the conventional case is set) beforehand, and alignment system ALG may be moved in the Y-axis direction only when detecting the mark(s) that cannot be detected by only moving the wafer stage two-dimensionally within the movement range in a state where alignment system ALG is fixed. Also in this case, the movement range in the Y-axis direction of wafer stages WST1 and WST2 can be smaller than the conventional case.

Incidentally, in the embodiment described above, the case has been described where the sections of the alignment system except for the light source are moved between the first and second measurement stations using alignment system stage AST, but the present invention is not limited thereto, and the whole alignment system including the light source may also be moved. Further, in the present invention, the detection area of the alignment system only has to move in the Y-axis direction, and therefore, for example, all the optical systems constituting the alignment system are not be moved but only part of the optical systems constituting the alignment system may be moved in the Y-axis direction. Furthermore, instead of or in combination with alignment system stage AST, a mechanism that optically moves the detection area can be used.

Figure 12:
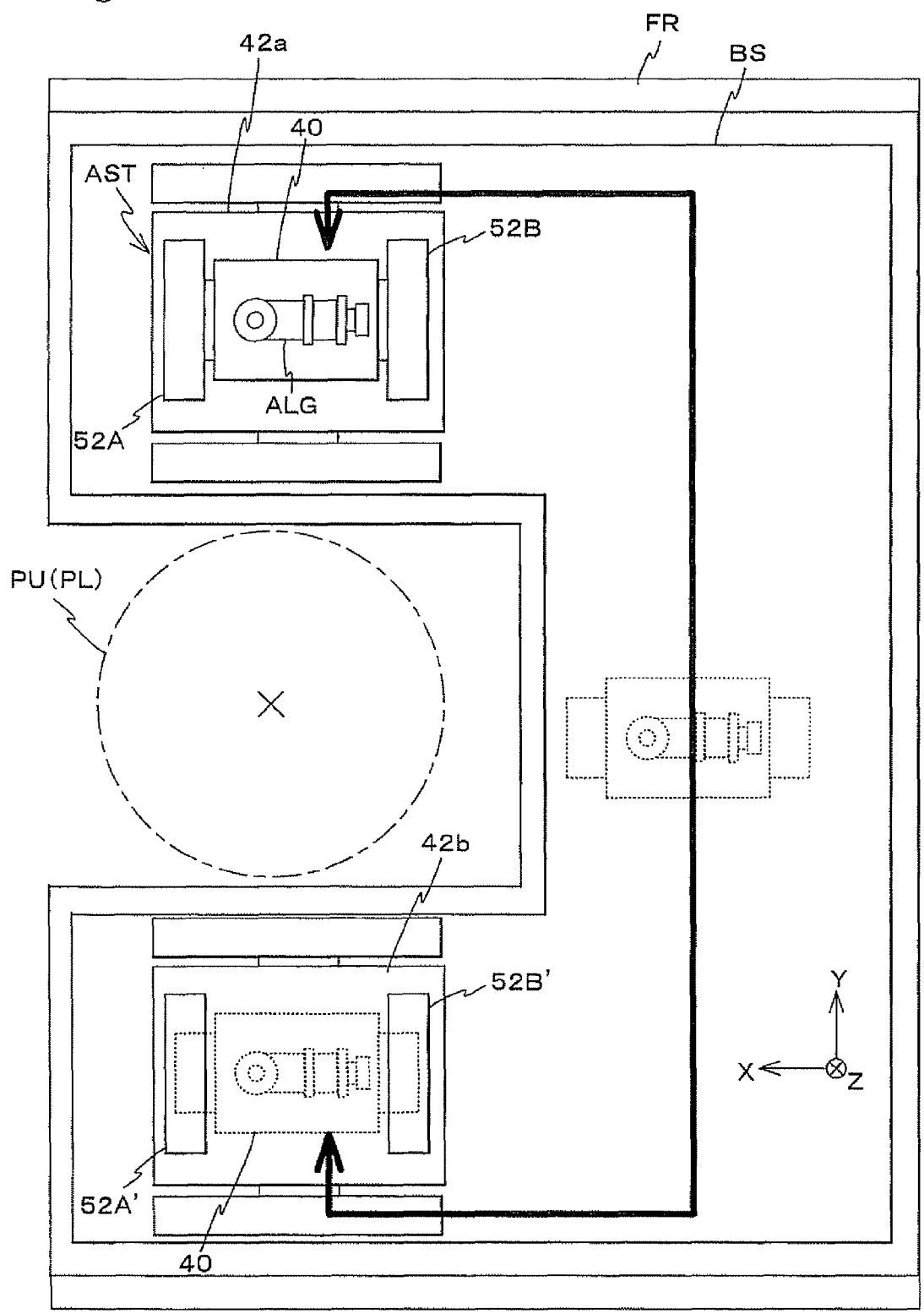
FIG. 12 is a view (No. 1) showing a configuration of an alignment system stage device related to a modified example.

Incidentally, in the embodiment described above, the case has been described where only one alignment system stage is arranged and the alignment system stage AST (movable stage 42) moves along the rail, but the present invention is not limited thereto. For example, as is shown in FIG. 12, two movable stages 42a and 42b (which fulfill a function of X stages in this case) that can move in the X-axis direction are arranged on the +Y side and the −Y side of projection unit PU respectively, and only Y stage 40 and alignment system ALG may be carried by a carrier device (not shown) that is composed of a robot arm and the like. In this case, as is shown in FIG. 12, stators 52A and 52B (52A' and 52B') of the Y linear motor can be arranged at each of movable stages 42a and 42b. Incidentally, in the case where such a configuration is employed, a configuration, in which the light source that constitutes the alignment system is respectively arranged on the +Y side and the −Y side of projection unit PU, and the light source and the optical system of the alignment system are connected at the time when Y stage 40 is mounted on each of movable stages 42a and 42b, can be employed. Further, as the Y linear motor, a moving-magnet type linear motor can be employed, taking into consideration drag of the wiring when carrying the Y-stage.

Further, not limited to the configuration in FIG. 12, a configuration may also be employed in which only a stator of a linear motor that drives movable stage 42 in the X-axis direction is arranged on the −Y side of projection unit PU, and movable stage 42, Y stage 40 and alignment system ALG are integrally carried by a carrier device (not shown).

Figure 13:
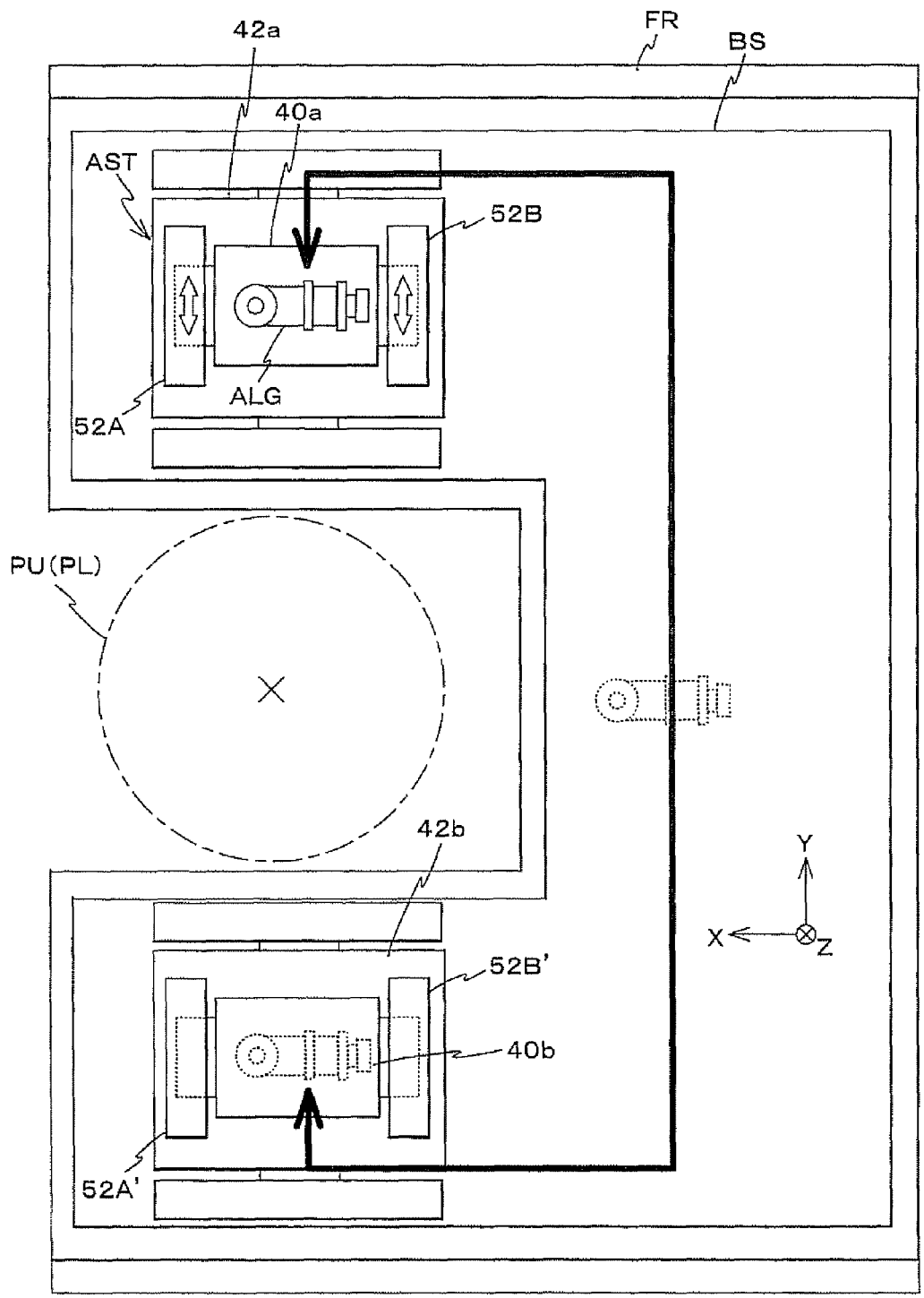
FIG. 13 is a view (No. 2) showing a configuration of an alignment system stage device related to another modified example.

Incidentally, instead of the alignment system stage device shown in FIG. 12, as is shown in FIG. 13, Y stages 40a and 40b are arranged at two movable stages 42a and 42b respectively, and only alignment system ALG may be carried by a carrier device (not shown) that is composed of a robot arm and the like. Incidentally, in both the case of FIG. 12 and the case of FIG. 13, a configuration in which the movable stages do not move in the X-axis direction may also be employed. From such a viewpoint, stators 52A and 52B (52A' and 52B') of the Y linear motors may be directly arranged at platform BS without arranging the movable stages. As is described above, the mechanism that moves the detection area of the alignment system in each of the first and second measurement stations and the mechanism that moves the alignment system between the first and second measurement stations are not limited to the configuration of the embodiment described above, and an arbitrary configuration may be employed.

Incidentally, in the embodiment described above, the case has been described where the projection center of projection optical system PL and the detection area of alignment system ALG in the first and second measurement stations (the first and second measurement positions described above) are placed along the Y-axis, but the present invention is not limited thereto, and the detection area of alignment system ALG may also be set at a position that is away from the projection center of projection optical system PL in a direction that intersects the X-axis and the Y-axis. That is, the first and second measurement positions at which the detection area of alignment system ALG is set in the first and second measurement stations may be made to differ from the projection center of projection optical system PL in the X-axis direction.

Incidentally, in the embodiment described above, alignment-system interferometer system 69 is to be used in order to measure positional information of the alignment system, but instead of or in combination with alignment-system interferometer system 69, another measurement device (e.g. an encoder or the like) may also be used. Further, although positional information of the reticle stage and the wafer stages are to be measured using the interferometer system in the embodiment described above, the present invention is not limited thereto, and for example, an encoder system that detects a scale (a diffraction grating) arranged on the upper surface of the wafer stage may also be used. In this case, it is preferable to employ a hybrid system equipped with the interferometer system and the encoder system and perform calibration of the measurement result of the encoder system using the measurement result of the interferometer system. Further, position control of the stages may be performed switching the interferometer system and the encoder system to be used or using both of them.

Incidentally, in the embodiment described above, as is shown in FIG. 2, the case has been described where the wafer stage device in which wafer stages WST1 and WST2 slide in the Y-axis direction is employed, but the present invention is not limited thereto. For example, a switching type wafer stage device, which is disclosed in Kohyo (published Japanese translation of International Publication for Patent Application) No. 2000-511704 (the pamphlet of International Publication No. 98/40791) and Kohyo (published Japanese translation of International Publication for Patent Application) No. 2000-505958 (the corresponding U.S. Pat. No. 5,969,441), can also be employed, and also in this case, it is possible to produce the effect similar to the embodiment described above. Incidentally, an exposure apparatus equipped with the switching type wafer stage device does not have to be equipped with two measurement stations, which are employed in the exposure apparatus of the embodiment described above, and may be equipped with only one measurement station separately from the exposure station.

Incidentally, in the embodiment described above, positional information of eleven alignment marks in total is to be detected, but the present invention is not limited thereto, and positional information of twelve or more, or ten or less alignment marks may be detected. Further, even in the case of detecting positional information of eleven alignment marks, positional information does not have to be detected in the order similar to the embodiment described above, and for example, the detection may also be started from the mark located on the −Y side in such an order of marks M1→M10→ M9→M2→M3→M11→M8→M7→M4→M5→M6, or the alignment marks can be detected in the other various orders. However, it is preferable that the detection is performed in the order with which the detection time of a plurality of alignment marks can be shortest regardless of the number of the alignment marks to be detected.

Incidentally, in the embodiment described above, rotational information of alignment system ALG is measured using alignment-system interferometer system 69 and the rotational information of alignment system ALG can be used when performing exposure. In this case, for example, positional information of the marks can be detected based on the positional information and rotational information of alignment system ALG and positional information of wafers W1 and W2.

Incidentally, in the embodiment described above, the case has been described where the present invention is employed in the exposure apparatus that has the stage device including two wafer stages, but the present invention is not limited thereto, and the present invention can also be employed in an exposure apparatus that has a stage device including a measurement stage that is movable independently from a wafer stage and has measurement members (fiducial marks, a sensor, and the like), as is disclosed in, for example, Kokai (Japanese Unexamined Patent Application Publication) No. 11-135400 (the corresponding pamphlet of International Publication No. 1999/23692), Kokai (Japanese Unexamined Patent Application Publication) No. 2000-164504 (the corresponding U.S. Pat. No. 6,897,963), the pamphlet of International Publication No. 2005/074014 and the like. Further, the present invention can also be employed in a stage device that includes only one wafer stage. In particular, the present invention is effective in the case where a projection optical system and an alignment system are placed spaced apart.

Incidentally, in the embodiment described above, the case has been described where only one alignment system is included, but the present invention is not limited thereto, and two alignment systems that can move in the Y-axis direction in accordance with wafer stages WST1 and WST2 can be included. Even in this case, by moving the alignment systems in the Y-axis direction and carrying out the alignment operation, the movement distance of each wafer stage in the Y-axis direction can be reduced, and the footprint can be narrowed, and therefore the apparatus can be downsized.

Further, in the embodiment described above, one alignment system is to be used both in the first and second measurement stations, but one alignment system or a plurality of alignment systems may also be arranged in each of the first and second measurement stations. In this case, because a mechanism that moves the alignment system between the first and second measurement stations becomes unnecessary, the footprint can be narrowed and therefore the apparatus can be downsized, compared with the exposure apparatus of the embodiment described above.

Figure 14:
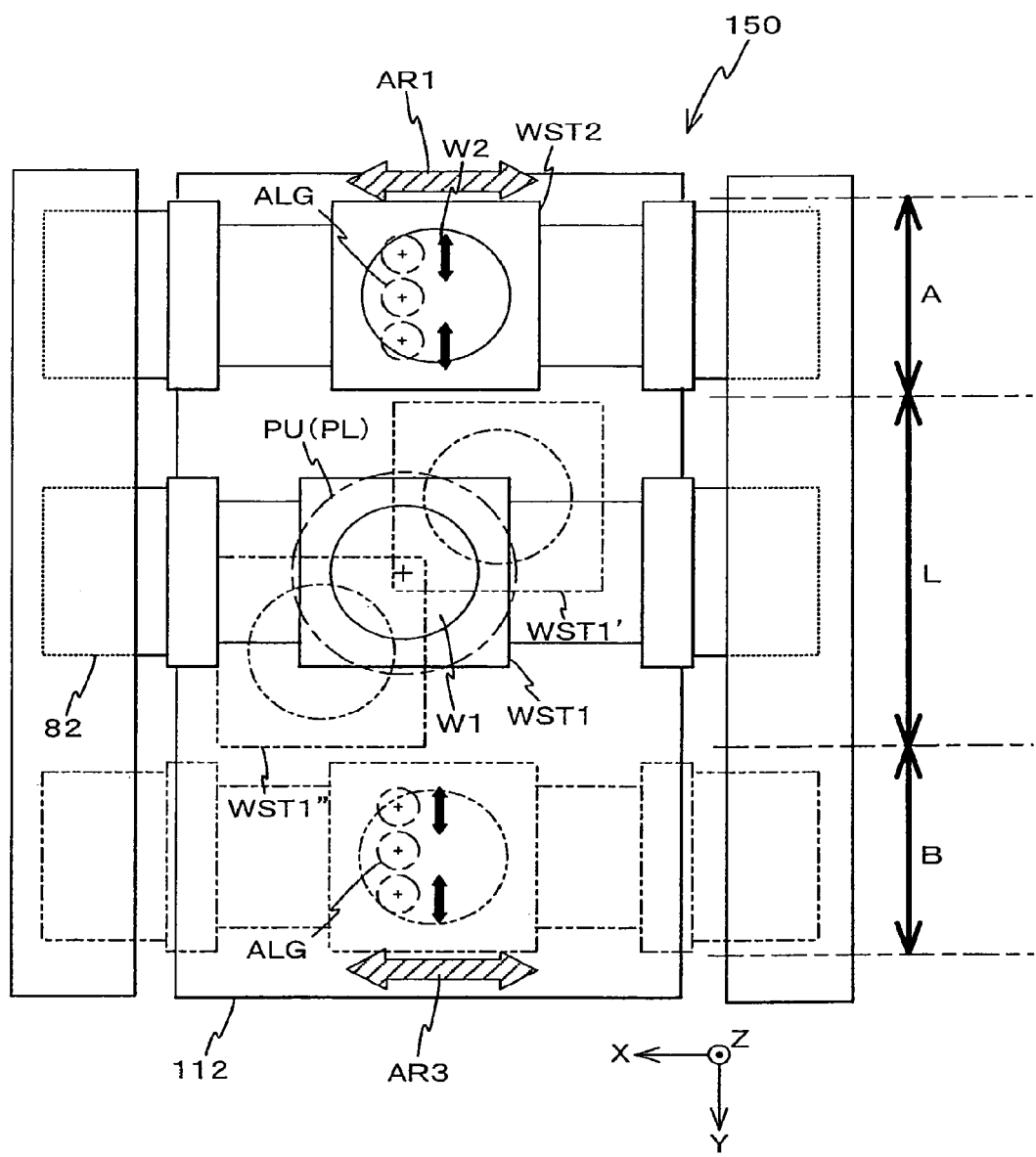
FIG. 14 is a view showing a configuration of an alignment system stage device related to a further modified example in which the mark detection system has a plurality of detection areas whose positions are different in at least one direction.

Further, in the embodiment described above, the detection area of alignment system ALG is moved in the Y-axis direction and a plurality of alignment marks including alignment marks (such as Ml to M5) whose positions are different in at least the Y-axis direction on a wafer are to be detected in each of the first and second measurement stations, but instead of moving the detection area, for example, an alignment system that has a plurality of detection areas whose positions are different in at least the Y-axis direction may also be used. FIG. 14 shows an example of such an alignment system having a plurality of detection areas whose positions are different in the Y-axis direction. It is preferable that this alignment system has at least one detection area whose position is variable in the Y-axis direction among the plurality of detection areas. In this case, a plurality of alignment marks including alignment marks whose positions are different in the Y-axis direction on the wafer can be detected by adjusting the position in the Y-axis direction of at least one of the plurality of detection areas based on the alignment shot data described above and also moving the wafer stage in the X-axis direction. Further, even if the wafer has alignment marks in a different placement, it becomes possible to similarly detect a plurality of alignment marks whose positions are different in the Y-axis direction on the wafer. In an exposure apparatus equipped with this alignment system, the detection areas of the alignment system are not moved and only the wafer stage is moved during the mark detection operation. Incidentally, this alignment system may be one alignment system having a plurality of detection areas, or may be a plurality of alignment systems each having one detection area.

Further, in the embodiment described above, only the mark detection is to be performed in the first and second measurement stations, but the present invention is not limited to thereto, and other detections, for example, detection of information on the surface shape of a wafer (including level difference information of the wafer surface or the like) or the like may also be performed. In this case, for example, a surface shape detection device having an irradiation system that irradiates a linear beam that is longer on the wafer than a diameter of the wafer and also parallel to the Y-axis, and a photodetection system that has a detector (such as a one-dimensional CCD sensor, a line sensor, or the like) that receives the beam reflected off the wafer may be arranged in the first and second measurement stations. As the surface shape detection device, the multipoint focal position detection system described earlier or the like can be used. Further, it is preferable that an irradiation area of the linear beam (a detection area of the surface shape detection device) is placed slightly spaced apart from the detection area of alignment system ALG in the X-axis direction, for example. With this placement, at least part of a detection operation of Z-position information of the wafer by the surface shape detection device can be performed in parallel with the mark detection operation by the alignment system. In an exposure apparatus equipped with this surface shape detection device, since the position and the attitude in the Z-axis direction of wafer table WTB are controlled based on the information on the surface shape when performing an exposure operation, both the exposure precision and the throughput can be improved. Incidentally, instead of the linear beam, for example, a plurality of spot beams may also be arrayed in a row.

Incidentally, the present invention can also be applied to a liquid immersion exposure apparatus that is disclosed in, for example, the pamphlet of International Publication No. 2004/053955, the European Patent Application Publication No. 1 420 298, the pamphlet of International Publication No. 2004/055803, the pamphlet of International Publication No. 2004/057590, the pamphlet of International Publication No. 2005/029559 (the corresponding U.S. Patent Application Publication No. 2006/0231206), and the like.

Further, in the embodiment described above, the case has been described where the present invention is applied to the scanning type exposure apparatus based on a step-and-scan method or the like, but the application range of the present invention is not limited thereto as a matter of course. That is, the present invention can also be applied to exposure apparatuses such as a projection exposure apparatus based on a step-and-repeat method, and further, to an exposure apparatus based on a step-and-stitch method, an exposure apparatus based on a proximity method, or a mirror projection aligner.

Incidentally, in the exposure apparatus in the embodiment described above, illumination light IL is not limited to the ArF excimer laser light, but a pulsed laser light such as a KrF excimer laser light (wavelength: 248 nm), an $F_2$ laser light (wavelength: 157 nm), an $Ar_2$ laser light (wavelength: 126 nm) or a $Kr_2$ laser light (wavelength: 146 nm), or an emission line from an extra-high pressure mercury lamp such as a g-line (wavelength: 436 nm) or an i-line (wavelength: 365 nm) can also be used. Further, a harmonic wave of a YAG laser, or as is disclosed in the pamphlet of International Publication No. 1999/46835 (the corresponding U.S. Pat. No. 7,023,610), a harmonic wave, which is obtained by amplifying a single-wavelength laser beam in the infrared or visible range emitted by a DFB semiconductor laser or fiber laser, with a fiber amplifier doped with, for example, erbium (or both erbium and ytteribium), and by converting the wavelength into ultraviolet light using a nonlinear optical crystal, may also be used.

Further, in the embodiment described above, the illumination light of the exposure apparatus is not limited to the light having a wavelength more than or equal to 100 nm, and it is needless to say that the light having a wavelength less than 100 nm may be used. For example, in recent years, in order to expose a pattern less than or equal to 70 nm, an EUV exposure apparatus that makes an SOR or a plasma laser as a light source generate an EUV (Extreme Ultraviolet) light in a soft X-ray range (e.g. a wavelength range from 5 to 15 nm), and uses a total reflection reduction optical system designed under the exposure wavelength (e.g. 13.5 nm) and the reflective mask has been developed. In the EUV exposure apparatus, the arrangement in which scanning exposure is performed by synchronously scanning a mask and a wafer using a circular arc illumination can be considered.

Further, the present invention can also be applied to an exposure apparatus that uses charged particle beams such as an electron beam, an ion beam, or the like. Incidentally, the electron beam exposure apparatus is based on either of a pencil beam method, a variable-shaped beam method, a cell projection method, a blanking-aperture array method, or a mask projection method.

Further, in the embodiment described above, a transmissive type mask (reticle), which is a transmissive substrate on which a predetermined light shielding pattern (or a phase pattern or a light attenuation pattern) is formed, is used. Instead of this reticle, however, as is disclosed in, for example, U.S. Pat. No. 6,778,257, an electron mask (or a variable shaped mask, including, for example, a DMD (Digital Micromirror Device) that is a type of a non-emission type image display device (which is also called a spatial light modulator) or the like) on which a light-transmitting pattern, a reflection pattern, or an emission pattern is formed according to electronic data of the pattern that is to be exposed may also be used. In the case where such a variable shaped mask is used, relative position control of a wafer and a pattern image may also be performed by changing a light-transmitting pattern or a reflection pattern to be formed based on electronic data, when exposing at least one shot area to which exposure will be performed after another shot area that has been exposed at the time of alignment mark detection, out of a plurality of shot areas on the wafer, taking the detection result of the alignment marks described above.

Further, the projection optical system in the exposure apparatus of the embodiment described above is not only a reduction system, but also may be either an equal magnifying system or a magnifying system, and the projection optical system is not only a dioptric system, but also may be either a catoptric system or a catadioptric system, and in addition, the projected image may be either an inverted image or an upright image. Moreover, the exposure area to which the illumination light is irradiated via the projection optical system is an on-axis area that includes the optical axis within the field of the projection optical system, but for example, as is disclosed in the pamphlet of International Publication No. 2004/107011 (the corresponding U.S. Patent Application Publication No. 2006/0121463), the exposure area may also be an off-axis area that does not include optical axis AX, similar to a so-called inline type catadioptric system, in part of which an optical system (a catoptric system or a catadioptric system) that has a plurality of reflection surfaces and forms an intermediate image at least once is arranged, and which has a single optical axis.

Further, as is disclosed in, for example, the pamphlet of International Publication No. 2001/035168, the present invention can also be applied to an exposure apparatus (a lithography system) that forms line-and-space patterns on a wafer by forming interference fringes on the wafer.

Moreover, the present invention can also be applied to an exposure apparatus that synthesizes two reticle patterns on a wafer via a projection optical system and almost simultaneously performs double exposure of one shot area on the wafer by one scanning exposure, as is disclosed in, for example, Kohyo (published Japanese translation of International Publication for Patent Application) No. 2004-519850 (the corresponding U.S. Pat. No. 6,611,316).

Incidentally, as long as the national laws in designated states (or elected states), to which this international application is applied, permit, the above disclosures of the various publications, the pamphlets of the International Publications, and the U.S. patents that are cited above are each incorporated herein by reference.

Further, an apparatus that forms a pattern on an object is not limited to the exposure apparatus (the lithography system) described above, but for example, the present invention can also be applied to an apparatus that forms a pattern on an object by an ink-jet method.

Incidentally, an object on which a pattern is to be formed (an object subject to exposure to which an energy beam is irradiated) in the above-described embodiment is not limited to a wafer, but may be other objects such as a glass plate, a ceramic substrate, a mask blank, a film member, or the like. Further, the shape of the object is not limited to a circular shape but may be other shapes such as a rectangular shape or the like.

The usage of the exposure apparatus is not limited to the exposure apparatus used for manufacturing semiconductor devices, but the present invention can be widely applied also to, for example, an exposure apparatus for manufacturing liquid crystal display devices which forms by transfer a liquid crystal display device pattern on a square-shaped glass plate, and to an exposure apparatus for manufacturing organic ELs, thin-film magnetic heads, imaging devices (such as CCDs), micromachines, DNA chips or the like. Further, the present invention can also be applied to an exposure apparatus that transfers a circuit pattern onto a glass substrate, a silicon wafer or the like not only when producing microdevices such as semiconductor devices, but also when producing a reticle or a mask used in an exposure apparatus such as an optical exposure apparatus, an EUV exposure apparatus, an X-ray exposure apparatus, an electron beam exposure apparatus, or the like.

Incidentally, semiconductor devices are manufactured through the following steps: a step where the function/performance design of a device is performed; a step where a reticle based on the design step is manufactured; a step where a wafer is manufactured using silicon materials; a lithography step where a pattern formed on the mask is transferred onto a photosensitive object by the exposure apparatus of the embodiment described above; a device assembly step (including a dicing process, a bonding process, and a packaging process); an inspection step; and the like. In this case, in the lithography step, the exposure apparatus of the embodiment described above in which the transfer property of the pattern is adjusted is used, and therefore productivity of highly-integrated devices can be improved.

Further, the exposure apparatus of the embodiment described above is manufactured by assembling various subsystems, which include the respective constituents that are recited in the claims of the present application, so as to keep predetermined mechanical accuracy, electrical accuracy and optical accuracy. In order to secure these various kinds of accuracy, before and after the assembly, adjustment to achieve the optical accuracy for various optical systems, adjustment to achieve the mechanical accuracy for various mechanical systems, and adjustment to achieve the electrical accuracy for various electric systems are performed. A process of assembling various subsystems into the exposure apparatus includes mechanical connection, wiring connection of electric circuits, piping connection of pressure circuits, and the like among various types of subsystems. Needless to say, an assembly process of individual subsystem is performed before the process of assembling the various subsystems into the exposure apparatus. When the process of assembling the various subsystems into the exposure apparatus is completed, a total adjustment is performed and various kinds of accuracy as the entire exposure apparatus are secured. Incidentally, the making of the exposure apparatus is preferably performed in a clean room where the temperature, the degree of cleanliness and the like are controlled.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. A pattern formation method of forming a pattern on an object in a predetermined pattern formation zone, the method comprising:

a mark detection process of, in a mark detection zone that is spaced apart from the pattern formation zone in at least a predetermined direction within a two-dimensional plane, moving a detection area of a mark detection system in at least the predetermined direction and detecting a mark placed on the object, the mark detection system performing mark detection of the mark on the object; and a pattern formation process of moving the object in the pattern formation zone based on a mark detection result in the mark detection process and forming a pattern on the object, wherein in the mark detection process, the detection area of the mark detection system is moved in the predetermined direction.

2. The pattern formation method according to claim 1, wherein the movement of the object is performed by movement of a movable body that holds the object.

3. The pattern formation method according to claim 2, wherein two of the movable bodies are used, and in parallel with the mark detection process being performed to an object held by one of the movable bodies, the pattern formation process is performed to an object held by the other of the movable bodies.

4. The pattern formation method according to claim 2, wherein two of the movable bodies are used, and also the mark detection zone includes a first mark detection zone that is spaced apart from the pattern formation zone to at least one side of the predetermined direction and a second mark detection zone that is spaced apart from the pattern formation zone to at least the other side of the predetermined direction, in parallel with the mark detection process being performed to an object held by one of the movable bodies in the first mark detection zone, the pattern formation process is performed to an object held by the other of the movable bodies in the pattern formation zone, and in parallel with the mark detection process being performed to an object held by the other of the movable bodies in the second mark detection zone, the pattern formation process is performed to an object held by the one of the movable bodies in the pattern formation zone.

5. The pattern formation method according to claim 4, further comprising:

a movement process of moving at least part of the mark detection system between the first and second mark detection zones, the movement process being performed between a mark detection process in one of the mark detection zones and a mark detection process in the other of the mark detection zones.

6. The pattern formation method according to claim 1, wherein the mark detection process includes:

detecting a mark on the object by the mark detection system before the movement of the detection area; and detecting another mark whose position is different from the detected mark in the predetermined direction on the object by the mark detection system after the movement of the detection area.

7. The pattern formation method according to claim 1, wherein in the mark detection process, the object is moved in a direction intersecting the predetermined direction.

8. The pattern formation method according to claim 1, wherein in the pattern formation process, a pattern is formed by exposing the object.

9. A device manufacturing method, including a process of forming a pattern on an object using the pattern formation method according to claim 1.

10. An exposure method of exposing an object, the method comprising:

detecting a mark on the object by a mark detection system, in a measurement zone whose position in at least a first direction is different from an exposure zone where exposure of the object is performed;

moving a detection area of the mark detection system in the first direction;

detecting another mark whose position is different from the detected mark in the first direction on the object by the mark detection system of which the detection area has been moved; and moving the object in the exposure zone using a detection result of the marks, wherein a plurality of marks that include marks whose positions are different in the first direction on the object are detected by the mark detection system.

11. The exposure method according to claim 10, wherein the plurality of marks include marks whose positions are different in a second direction orthogonal to the first direction on the object, and the object is moved in the second direction in order to detect the marks whose positions are different in the second direction in the measurement zone.

12. The exposure method according to claim 10, wherein during exposure of the object in the exposure zone, a plurality of marks on an object that is to be exposed next are detected in the measurement zone.

13. The exposure method according to claim 10, wherein the measurement zone is respectively placed on both sides of the exposure zone in the first direction, and an object to which the detection of the marks has been performed in each of the two measurement zones is alternately carried in the exposure zone.

14. The exposure method according to claim 10, wherein information on a surface shape of the object is detected in the measurement zone.

15. A device manufacturing method, including:

a process of forming a pattern on a sensitive object using the exposure method according to claim 10.

16. An exposure method of exposing an object, the method comprising:

detecting a plurality of marks on the object by a mark detection system that has a plurality of detection areas whose positions are different in a first direction, in a measurement zone whose position in at least the first direction is different from an exposure zone where exposure of the object is performed; and moving the object in the exposure zone using a detection result of the marks, wherein the plurality of marks include marks whose positions are different in a second direction orthogonal to the first direction on the object, and the object is moved in the second direction in order to detect the marks whose positions are different in the second direction in the measurement zone.

17. The exposure method according to claim 16, wherein prior to the detection of the marks, a position in the first direction of at least one of the plurality of detection areas is adjusted in accordance with alignment information of the plurality of marks.

18. The exposure method according to claim 16, wherein marks whose positions are different in the first direction on the object are substantially simultaneously detected by the mark detection system.

19. The exposure method according to claim 16, wherein during exposure of the object in the exposure zone, a plurality of marks on an object that is to be exposed next are detected in the measurement zone.

20. The exposure method according to claim 16, wherein the measurement zone is respectively placed on both sides of the exposure zone in the first direction, and an object to which the detection of the marks has been performed in each of the two measurement zones is alternately carried in the exposure zone.

21. The exposure method according to claim 16, wherein information on a surface shape of the object is detected in the measurement zone.

22. A device manufacturing method, including:
a process of forming a pattern on a sensitive object using the exposure method according to claim 16.

23. A pattern formation apparatus that forms a pattern on an object in a predetermined pattern formation zone, the apparatus comprising:
a movable body that moves holding the object;
a mark detection system that detects a plurality of marks on the object in a mark detection zone that is spaced apart from the pattern formation zone in at least a predetermined direction within a two-dimensional plane; and
a controller that moves a detection area of the mark detection system in at least the predetermined direction and sequentially detects the plurality of marks, and moves the movable body in the pattern formation zone based on a result of the detection and forms a pattern on the object, wherein
the mark detection by the mark detection system is performed before the movement of the detection area and after the movement of the detection area.

24. The pattern formation apparatus according to claim 23, wherein
two of the movable bodies are provided, and
the controller, in parallel with forming a pattern on the object at one of the movable bodies, detects the marks on the object at the other of the movable bodies.

25. The pattern formation apparatus according to claim 23, wherein
two of the movable bodies are provided, and also the mark detection zone includes a first mark detection zone that is spaced apart from the pattern formation zone to at least one side of the predetermined direction and a second mark detection zone that is spaced apart from the pattern formation zone to at least the other side of the predetermined direction, which correspond to the two movable bodies respectively, and
the controller
in parallel with performing the mark detection at the one of the movable bodies in the first mark detection zone, forms a pattern on the object at the other of the movable bodies in the pattern formation zone, and
in parallel with performing the mark detection at the other of the movable bodies in the second mark detection zone, forms a pattern on the object at the one of the movable bodies in the pattern formation zone.

26. The pattern formation apparatus according to claim 25, wherein
the controller moves at least part of the mark detection system between the first and second mark detection zones, between when the mark detection is performed in one of the mark detection zones and when the mark detection is performed in the other of the mark detection zones.

27. The pattern formation apparatus according to claim 23, wherein
the mark detection system has a light source and an optical system, and
the controller moves the optical system of the mark detection system between the first and second mark detection zones, between when the mark detection is performed in one of the mark detection zones and when the mark detection is performed in the other of the mark detection zones.

28. The pattern formation apparatus according to claim 27, wherein
the light source of the mark detection system includes a first light source arranged on a side of one of the mark detection zones and a second light source arranged on a side of the other of the mark detection zones, and
the controller performs the mark detection using any one of the first and second light sources, depending on which mark detection zone the optical system of the mark detection system is located in.

29. The pattern formation apparatus according to claim 23, further comprising:
a position measurement device that measures a position of the detection area of the mark detection system.

30. The pattern formation apparatus according to claim 29, wherein
the position measurement device includes an interferometer.

31. An exposure apparatus that exposes an object, the apparatus comprising:
a movable body that moves holding the object;
a mark detection system that detects a plurality of marks on the object in a measurement zone whose position in at least a first direction is different from an exposure zone where exposure of the object is performed; and
a controller that moves a detection area of the mark detection system in the first direction and detects the plurality of marks on the object using the mark detection system, and also controls movement of the movable body holding the object in the exposure zone using a detection result of the marks by the mark detection system, wherein
the mark detection by the mark detection system is performed before the movement of the detection area and after the movement of the detection area.

32. The exposure apparatus according to claim 31, wherein
the plurality of marks include marks whose positions are different in a second direction orthogonal to the first direction on the object, and
the controller moves the movable body holding the object in the second direction in order to detect the marks whose positions are different in the second direction using the mark detection system in the measurement zone.

33. The exposure apparatus according to claim 31, wherein
during exposure of the object in the exposure zone, the controller detects a plurality of marks on an object that is to be exposed next using the mark detection system in the measurement zone.

34. The exposure apparatus according to claim 31, wherein
two of the movable bodies are provided, and also the measurement zone is respectively placed on both sides of the exposure zone in the first direction, and the controller controls movement of the two movable bodies so that an object to which the detection of the marks has been performed in each of the two measurement zones is alternately carried in the exposure zone.

35. The exposure apparatus according to claim 31, further comprising:
a detection device that detects information on a surface shape of the object in the measurement zone.

36. An exposure apparatus that exposes an object, the apparatus comprising:
a movable body that moves holding the object;
a mark detection system that has a plurality of detection areas whose positions are different in a first direction and detects a plurality of marks on the object in a measurement zone whose position in at least the first direction is different from an exposure zone where exposure of the object is performed; and
a controller that controls movement of the movable body holding the object in the exposure zone using a detection result of the marks, wherein
the plurality of marks include marks whose positions are different in a second direction orthogonal to the first direction on the object, and
the controller moves the movable body holding the object in the second direction in order to detect the marks whose positions are different in the second direction using the mark detection system in the measurement zone.

37. The exposure apparatus according to claim 36, further comprising:
an adjustment device that adjusts a position in the first direction of at least one of the plurality of detection areas in accordance with alignment information of the plurality of marks, prior to the detection of the marks.

38. The exposure apparatus according to claim 36, wherein the mark detection system is capable of substantially simultaneously detecting marks whose positions are different in the first direction on the object.

39. The exposure apparatus according to claim 36, wherein during exposure of the object in the exposure zone, the controller detects a plurality of marks on an object that is to be exposed next using the mark detection system in the measurement zone.

40. The exposure apparatus according to claim 36, wherein two of the movable bodies are provided, and also the measurement zone is respectively placed on both sides of the exposure zone in the first direction, and
the controller controls movement of the two movable bodies so that an object to which the detection of the marks has been performed in each of the two measurement zones is alternately carried in the exposure zone.

41. The exposure apparatus according to claim 36, further comprising:
a detection device that detects information on a surface shape of the object in the measurement zone.

* * * * *

UNITED STATES PATENT AND TRADEMARK OFFICE
CERTIFICATE OF CORRECTION

| | | |
|---|---|---|
| PATENT NO. | : 8,400,614 B2 | Page 1 of 1 |
| APPLICATION NO. | : 12/144226 | |
| DATED | : March 19, 2013 | |
| INVENTOR(S) | : Shibazaki | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1165 days.

Signed and Sealed this
Eleventh Day of November, 2014

Michelle K. Lee
*Deputy Director of the United States Patent and Trademark Office*